(12) United States Patent
Choi

(10) Patent No.: US 12,243,721 B2
(45) Date of Patent: Mar. 4, 2025

(54) PLASMA GENERATING DEVICE AND PROCESS EXECUTING APPARATUS INCLUDING THE SAME

(71) Applicant: NP Holdings Co., Ltd., Suwon-si (KR)

(72) Inventor: Dai Kyu Choi, Seoul (KR)

(73) Assignee: NP HOLDINGS CO., LTD., Suwon-si (KR)

( * ) Notice: Subject to any disclaimer, the term of this patent is extended or adjusted under 35 U.S.C. 154(b) by 145 days.

(21) Appl. No.: 18/002,922

(22) PCT Filed: Aug. 17, 2021

(86) PCT No.: PCT/KR2021/010868
§ 371 (c)(1),
(2) Date: Dec. 22, 2022

(87) PCT Pub. No.: WO2022/035300
PCT Pub. Date: Feb. 17, 2022

(65) Prior Publication Data
US 2023/0245861 A1     Aug. 3, 2023

(30) Foreign Application Priority Data

Aug. 14, 2020 (KR) ........................ 10-2020-0102809
Aug. 13, 2021 (KR) ........................ 10-2021-0107422

(51) Int. Cl.
*H01J 37/32* (2006.01)
(52) U.S. Cl.
CPC .. *H01J 37/32449* (2013.01); *H01J 37/32357* (2013.01); *H01J 37/32513* (2013.01); *H01J 37/32522* (2013.01); *H01J 37/32862* (2013.01); *H01J 37/32871* (2013.01); *H01J 37/321* (2013.01); *H01J 2237/002* (2013.01); *H01J 2237/024* (2013.01); *H01J 2237/24585* (2013.01); *H01J 2237/3321* (2013.01)

(58) Field of Classification Search
CPC .......... H01J 37/32449; H01J 37/32357; H01J 37/32513; H01J 37/32522; H01J 37/32862; H01J 37/32871; H01J 37/321; H01J 2237/002; H01J 2237/024; H01J 2237/24585; H01J 2237/3321; H01J 37/32
See application file for complete search history.

(56) References Cited

U.S. PATENT DOCUMENTS

2004/0003828 A1\* 1/2004 Jackson .............. C23C 16/0227
257/E21.228
2009/0014423 A1\* 1/2009 Li ......................... C01B 33/029
219/121.52
(Continued)

FOREIGN PATENT DOCUMENTS

CN         111261544 A  *  6/2020   ........ H01J 37/32862
KR       20-0419108 Y1      6/2006
(Continued)

*Primary Examiner* — Abdullah A Riyami
*Assistant Examiner* — Syed M Kaiser
(74) *Attorney, Agent, or Firm* — NKL Law; Jae Youn Kim

(57) ABSTRACT

Disclosed is a plasma generating device which includes a reactor body having a gas injection hole on one side thereof, and a collector connected to an opposite side of the reactor body and having a collection space in an interior thereof. The reactor body and the collector provide a reaction space having a plasma channel in an interior thereof.

19 Claims, 37 Drawing Sheets

(56) References Cited

U.S. PATENT DOCUMENTS

| | | | | |
|---|---|---|---|---|
| 2014/0262744 | A1* | 9/2014 | Locke | B01J 19/088 |
| | | | | 422/186.04 |
| 2014/0263181 | A1* | 9/2014 | Park | H01J 37/32146 |
| | | | | 216/68 |
| 2015/0307775 | A1* | 10/2015 | Casey | C09D 183/02 |
| | | | | 264/483 |
| 2018/0240656 | A1* | 8/2018 | Gorokhovsky | C23C 14/22 |
| 2018/0247797 | A1* | 8/2018 | Gorokhovsky | C23C 14/0605 |
| 2021/0229061 | A1* | 7/2021 | Stowell | B01J 19/126 |

FOREIGN PATENT DOCUMENTS

| | | | | |
|---|---|---|---|---|
| KR | 1020070007783 | B1 | | 8/2007 |
| KR | 10-2009-0102183 | A | | 9/2009 |
| KR | 101296717 | B1 | * | 8/2013 |
| KR | 20160129304 | A | * | 11/2016 |
| KR | 10-1776235 | B1 | | 9/2017 |
| KR | 10-2020-0048982 | A | | 5/2020 |
| KR | 102113293 | B1 | * | 5/2020 |
| KR | 10-2113294 | B1 | | 6/2020 |

\* cited by examiner

PLASMA GENERATING DEVICE AND PROCESS EXECUTING APPARATUS INCLUDING THE SAME

TECHNICAL FIELD

The present disclosure relates to a plasma generating device and a process executing apparatus including the same.

BACKGROUND ART

To manufacture a display or a semiconductor, processes such as deposition, ashing, etching, and cleaning often are performed at a low pressure. In particular, among proved technologies that may be used in treating a thin film in an integrated circuit (IC) manufacturing process, a chemical vapor deposition (CVD) method are often used in commercialized processes. An atom layer deposition (ALD) that is a modification of the CVD is now known as an excellent method that may achieve uniformity, an excellent step coverage, and a cost effective scalability for increasing a size of a substrate.

In the new process of the ALD process system, a flow rate of a process gas increases as a size of a process wafer increases. The increase in the process by-product influences an operation of a pump for discharging exhaust gas in the process system, and badly influences a main treatment process due to maintenance and repair of the pump.

DETAILED DESCRIPTION OF THE INVENTION

Technical Problem

An aspect of the present disclosure provides a plasma generating device for effectively removing process by-product that is generated in a semiconductor process or the like.

Another aspect of the present disclosure provides a process executing apparatus that employs the plasma generating device.

Technical Solution

According to an embodiment of the present disclosure, a plasma generating device includes a reactor body having a gas injection hole on one side thereof, and a collector connected to an opposite side of the reactor body and having a collection space in an interior thereof, and the reactor body and the collector provide a reaction space having a plasma channel in an interior thereof.

According to an embodiment of the present disclosure, the collector may include a collection container surrounding the collection space, and a portion of the reaction space and a portion of the collection space overlap each other.

According to an embodiment of the present disclosure, the reactor body may have a shape, in which at least two branches are branched such that the branches correspond to portions of a toroid connected to the collector, and further includes at least one insulator provided in the reactor body, and the insulator may be provided at least one of between bodies constituting the reactor body, and between the reactor body and the collector.

According to an embodiment of the present disclosure, the plasma generating device may further include a reactor docking part connected to the branches of the reactor body and that defines a portion of the reaction space, a collector docking part extending from the collector toward the reactor body and on which the reactor docking part is seated, a sealing member inserted between the reactor docking part and the collector docking part, and a coupling means coupling the reactor docking part and the collector docking part.

According to an embodiment of the present disclosure, the reactor docking part may include an area restricting member provided between the reactor body and the collection container and defining at least a portion of a reaction area.

According to an embodiment of the present disclosure, the plasma generating device of claim 3, wherein the insulator includes at least two sealing members that seals the reaction space, and the sealing members may be sequentially disposed along a first direction that faces an outside from an inside of the reactor body, or may be sequentially disposed along a second direction that is perpendicular to the first direction.

According to an embodiment of the present disclosure, the insulator may further include a first insulation member provided between the reaction space and the sealing members such that the sealing members are not exposed to the reaction space.

According to an embodiment of the present disclosure, a cross-section of the first insulation member may have a shape that is asymmetrical to a line that is perpendicular to a ground surface.

According to an embodiment of the present disclosure, the reactor body may include first and second branch parts branched to two sides in a direction that is perpendicular to an axis with respect to the gas injection hole, and the first and second branch parts may include first band second parallel portions extending in a direction that is parallel to the gas injection hole, a first shoulder part connecting the gas injection hole and the first parallel portion, and a second shoulder part connecting the gas injection hole and the second parallel portion, wherein in the first and second shoulder parts, a spacing distance of an inner surface that contacts a plasma forming space from the plasma channel is larger than those of the first and second parallel portions.

According to an embodiment of the present disclosure, the plasma generating device may further include a temperature sensor that senses a temperature of the reactor body, at least one cooling part provided in the reactor body, and a controller that controls an on/off state of at least one of the reactor body and the cooling part based on the temperature sensed by the temperature sensor.

According to an embodiment of the present disclosure, the cooling part may be spaced apart from the reactor body, and the plasma generating device may further include an absorption member provided between the reactor body and the cooling part as a conductor, and that absorbs heat transfer between the reactor body and the cooling part.

According to an embodiment of the present disclosure, the plasma generating device may further include a heating part provided between the reactor body and the cooling part and that provides heat for raising a temperature of the reactor body.

According to an embodiment of the present disclosure, the plasma generating device may further include an igniter mounted on the reactor body and that initiates plasma discharge in the reaction space, and the igniter may include an ignition port extending from the reactor body, an ignition electrode, at least a portion of which is provided in the ignition port, and sealing members provided between the ignition port and the ignition electrode, and spaced apart from the ignition electrode.

According to an embodiment of the present disclosure, the ignition port may be integrally formed with the reactor body so as not to be separated therefrom, and the ignition port may include an extension part protruding and extending from the reactor body, and a flange provided at an end of the extension part, which is opposite to the reactor body.

According to an embodiment of the present disclosure, the ignition electrode may include an electrode body, one end of which faces the reactor body, and a head part connected to the electrode body and having a diameter that is larger than that of the electrode body.

According to an embodiment of the present disclosure, the collector may include a housing disposed on a passage of an exhaust gas and that provides a collection space for collecting powder, and a passage guide provided in the collection space and that changes a direction of the passage of the exhaust gas.

According to an embodiment of the present disclosure, the passage guide may include a partition part dividing the collection space into two or more spaces, the partition part may include a plate-shaped portion disposed in the collector to be adjacent to the first exhaustion part connected to the reactor body and that guides the passage of the exhaust gas, and a communication portion disposed to be spaced apart from the first exhaustion part while the plate-shaped portion being interposed therebetween, and an upper end of the communication portion may be opened and a lower end thereof may be connected to a second exhaustion part disposed to be spaced apart from the first exhaustion part and from which the exhaust gas is discharged.

According to an embodiment of the present disclosure, the housing may be provided with a cleaning port that is opened and closed to remove the powder collected in the collection space.

According to an embodiment of the present disclosure, the plasma generating device may further include a connector, one end of which is provided in the gas injection hole and which has two or more openings communicated with an interior of the reactor body at an opposite end thereof, and the connector may include a main body, and a main injector hole connected to the main body and into which process by-product are injected as one of the openings, and an auxiliary injection hole connected to the main body and into which an additional gas is injected as another one of the openings.

According to an embodiment of the present disclosure, a process chamber that treats a substrate may be connected to a front end of the reactor body, and an exhaustion pump may be connected to a rear end of the collector.

Advantageous Effects of the Invention

According to an embodiment of the present disclosure, a by-product treatment efficiency may be enhanced by forming a plasma discharge channel even in an interior space of a collector space, and manufacturing costs of a main body may be reduced by excluding a portion of the reactor body.

Furthermore, according to an embodiment of the present disclosure, a plasma generating device that may secure a process time of a main treatment process by prolonging a pump operation time that is influenced by by-product may be provided.

According to an embodiment of the present disclosure, a reactor system that is employed in the plasma generating device is provided.

According to an embodiment of the present disclosure, a process executing apparatus that includes the plasma generating device is provided.

DESCRIPTION OF THE DRAWINGS

FIG. 21A is a perspective view, FIG. 21B is a cross-sectional view of FIG. 21A, and FIG. 21C is a perspective view illustrating the area restricting member of FIG. 21A.

FIG. 22A is a perspective view, FIG. 22B is a cross-sectional view of FIG. 22A, and FIG. 22C is a perspective view illustrating the area restricting member of FIG. 22A.

FIG. 23A is a perspective view, FIG. 23B is a cross-sectional view of FIG. 23A, and FIGS. 23C and 23D are perspective views illustrating the area restricting member of FIG. 23A.

FIG. 24A is a perspective view and FIGS. 24B and 24C are cross-sectional views of a portion of FIG. 24A.

BEST MODE

Figure 1:
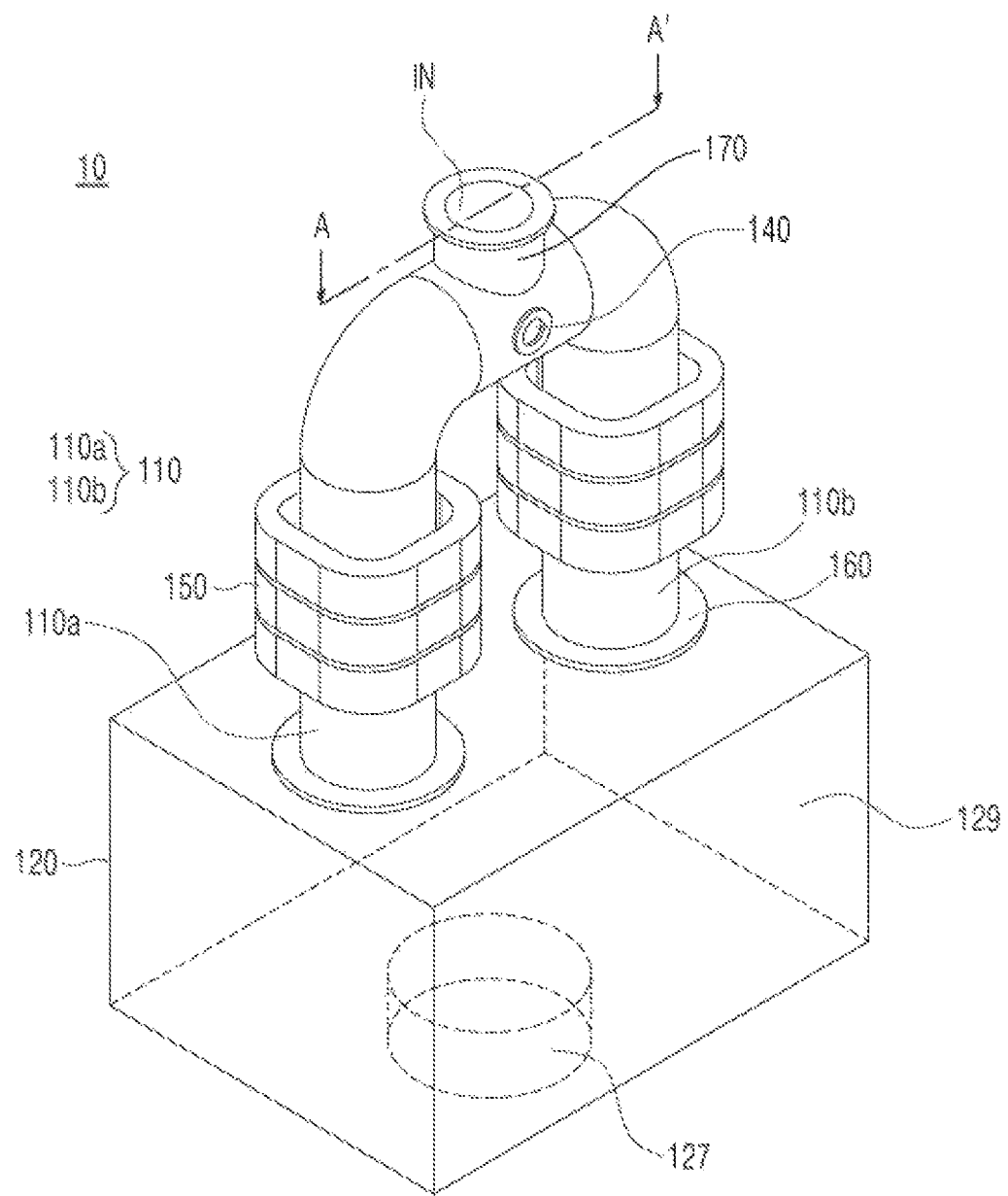
FIG. 1 is a perspective view illustrating a plasma generating device.

The present disclosure can be variously changed and various forms are possible, and specific embodiments will be illustrated in the drawings and the detailed description thereof in detail. However, the embodiments according to the concept of the present disclosure are not intended to limit the specific disclosed forms, and it should be understood that the present disclosure includes all changes, equivalents, and replacements included in the spirit and technical scope of the present disclosure.

Hereinafter, exemplary embodiments of the present disclosure will be described in more detail with reference to the accompanying drawings.

An embodiment of the present disclosure relates to a reactor of a plasma generating device used for a semiconductor process or the like.

In an embodiment of the present disclosure, plasma refers to a material including a set of electrically charged particles associated with a gas, or a state of the material. Here, according to a used one, plasma may include ionized species, such as radicals, and neutrons and/or molecules bonded to the ionized species. A material in a reactor is not limited to such materials that are present alone as species in a plasma state, but refers to all plasmas.

In an embodiment of the present disclosure, the reactor includes gases and/or plasma, and refers to a container which may ignite and/or continue the plasma, or a portion of the container. The reactor may be coupled to various other parts included in the plasma generating device, and for example, may be coupled other parts, such as a power generator or cooling parts. The reactor may restrict channels having various shapes. For example, the channels may have line shape or ring shapes (to provide toroidal plasma).

The plasma generating device may be disposed in a preliminary operation or a post operation of a process chamber for a semiconductor process. The process chamber for a semiconductor process may be for performing substrate etching, deposition, and cleaning processes, and the like.

An embodiment of the present disclosure may be a reactor of a plasma generating device, a plasma generating device including the reactor, and a process executing apparatus including the plasma generating device. In an embodiment of the present disclosure, the plasma generating device refers to a plasma system, and may further include an additional process part in addition to the above-described parts. For example, the plasma system may include one or more reactors, power supply parts, a measurement parts, control parts, and the like, and additional various other parts.

The reactor, and/or the plasma generating device including the same according to an embodiment of the present disclosure may be used for a semiconductor process and the like. In particular, the reactor, and/or the plasma generating device including the same according to an embodiment of the present disclosure may be used for treatment of exhaust gases generated during the process.

Figure 2:
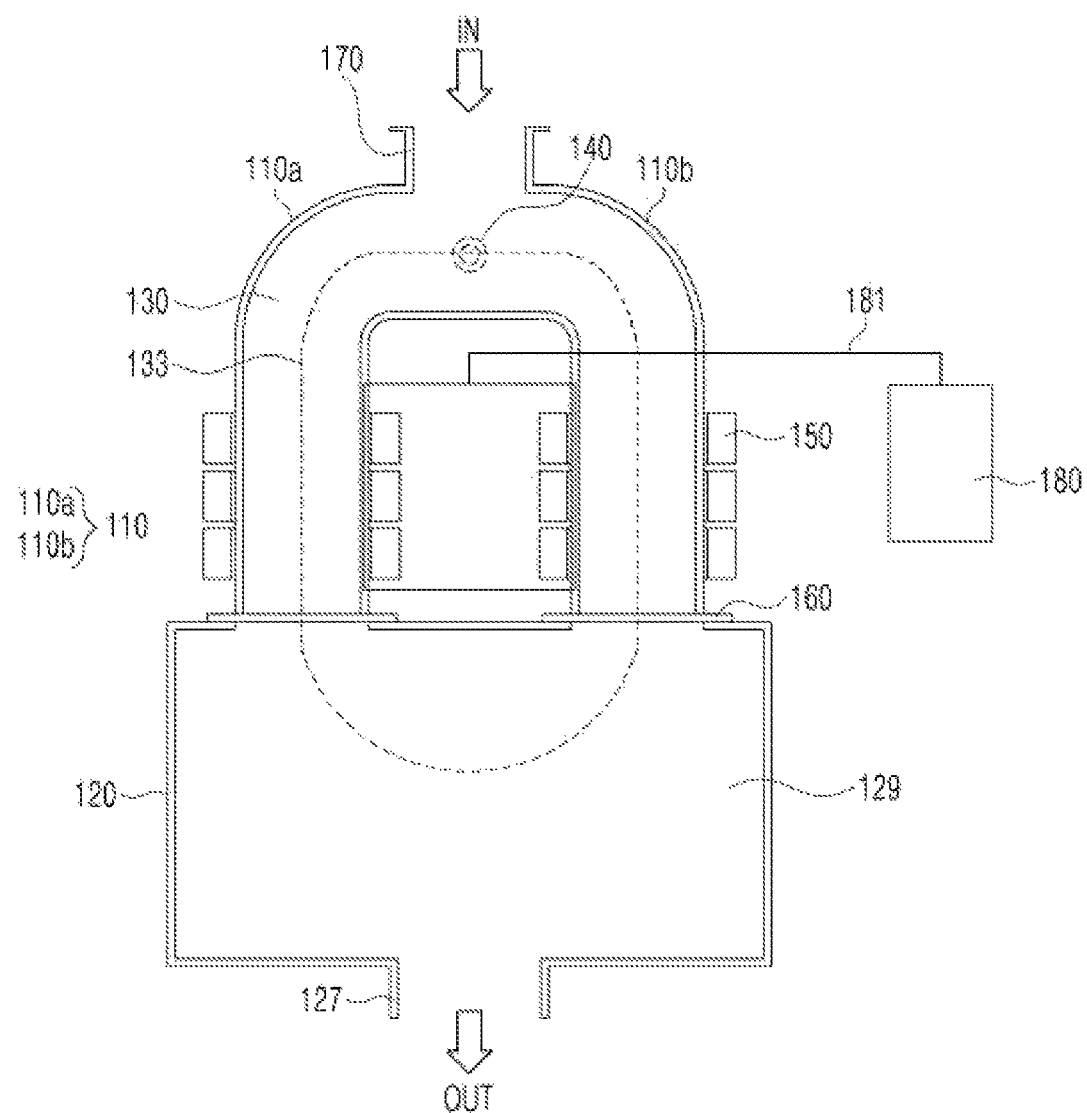
FIG. 2 is a cross-sectional view taken along line A-A' of FIG. 1.

FIG. 1 is a perspective view illustrating a plasma generating device, and FIG. 2 is a cross-sectional view along line A-A' of FIG. 1.

Referring to FIGS. 1 and 2, a plasma generating device 10 may include a reactor system 100, a transformer 150, and a power supply part 180.

The reactor system 100 is a main configuration of the plasma generating device, and includes a reactor body 110 that provides an interior space for defining a plasma channel 133, and a collector 120 that is connected to the reactor body 110 and has a collection space 129 in an interior thereof.

The reactor body 110 is provided with a space 130 (hereinafter, will be referred to as an interior space of the reactor system 100, a plasma channel space, and the like), which has a shape corresponding to a portion of a toroid and in which the plasma channel 133 is formed, in an interior thereof. The plasma channel 133 is formed in the reactor body 110 to form flows of plasma. The plasma channel 133 may include gases and/or plasma, and gas species and plasma species may be exchanged through one or more inlets and one or more outlets of the reactor such that they are received or fed. The plasma channel 133 has a specific length, and here, the length of the plasma channel 133 means a length of a total path, in which plasma may be present. In the drawings, the length is indicated in a form of a line obtained by connecting points of the highest concentrations of plasma on a cross section of an area, in which the plasma channel 133 is formed.

In an embodiment of the present disclosure, the plasma system may include means for applying a DC or AC electric field in the channel, may maintain plasma in the plasma channel 133 by using the electric field, and may ignite the plasma in the plasma channel 133 alone or while cooperating with other means.

A gas injection hole 170 is adapted to supply gases to the plasma channel forming space, and one end thereof is opened to an outside and an opposite end thereof is connected to the toroid such that it is provided in a form having an opening of a specific diameter, which communicated with the plasma channel forming space.

The reactor body 110 may be branched to at least two branches with respect to an area, in which the gas injection hole 170 is installed. For example, the reactor body 110, as illustrated, may be branched to a first branch 110a and a second branch 110b. However, the present disclosure is not limited thereto, and the reactor body 110 may be branched to four branches or other numbers of branches. The branched branches are connected to the collector 120 provided on a lower side.

The at least two branches may be provided substantially symmetrical to each other with respect to a line or a surface that passes between the at least two branches. In an embodiment of the present disclosure, the first branch 110a and the second branch 110b may be symmetrical to each other to opposite sides with respect a line or a surface that passes the gas injection hole 170 perpendicularly thereto and passes through an igniter 140.

In an embodiment of the present disclosure, the reactor body 110 may be integrally formed while not being separated. For example, in an embodiment of the present disclosure, the reactor body 110 may be manufactured integrally while not being separated and not using welding, by using a lost wax scheme. However, the present disclosure is not limited thereto, and the reactor body 110 may include at least two parts (that is, a plurality of sub bodies) and be connected to each other through welding or the like.

The lost wax scheme is a technology for dissolving a metal of a solid state into a liquid state, in which a deformation resistance is low, injecting the liquid metal into a cast having a desired shape, and coagulating it to manufacture a product of a desired shape at once. To achieve this, the cast is finished by manufacturing a wax pattern through a mold having the same shape as that of the product, applying fireproof particles to the wax pattern, and then heating the wax pattern to melt and remove the wax. A final shape result of a metal may be obtained by melting a desired metal, pouring the metal into the cast, solidifying the metal, and removing the cast.

According to an embodiment of the present disclosure, when the reactor body 110 is provided with a plurality of sub bodies, the sub bodies may be manufactured by the lost wax scheme. In an embodiment of the present disclosure, various metals may be used as a material that forms the reactor body 110, and for example, stainless steel (SUS), an aluminum alloy, and the like may be used.

The reactor body 110 may be formed of a conductive material. When the reactor body 110 is formed of a conductive material, it may be manufactured of various metallic materials or coated metallic materials. The reactor body 110, for example, may be manufactured of a metallic material, such as aluminum, stainless steel, and copper, anodized aluminum, nickel-plated aluminum, and the like.

In the drawings, a flow direction of a gas from an outside to the gas injection hole 170 is indicated by IN.

The reactor body 110 may be provided with the igniter 140 for initiating plasma discharge. In the present disclosure, the ignition is a process that is a cause of an initial collapse of the gas to form the plasma. The igniter 140 may be disposed at various locations, but in an embodiment of the present disclosure, it may be disposed around the gas injection hole 170. The igniter 140 may have an ignition gas injection hole (not illustrated), through which an ignition gas for igniting plasma is injected.

Figure 3:
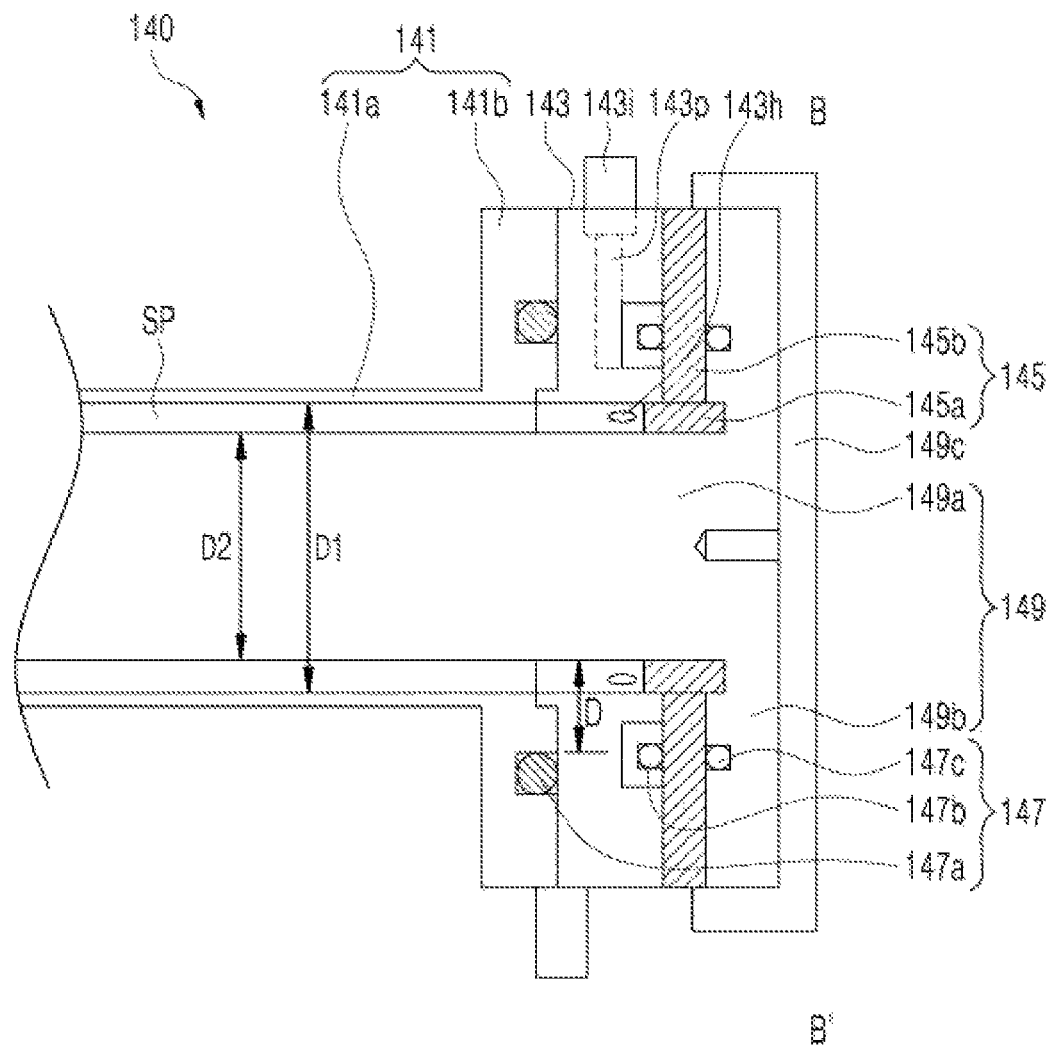
FIG. 3 is a cross-sectional view illustrating an igniter according to an embodiment of the present disclosure.

FIG. 3 is a cross-sectional view illustrating the igniter 140 according to an embodiment of the present disclosure.

Referring to FIG. 3, the igniter 140 includes an ignition port 141 that extends from a main body, an ignition electrode 149, at least a portion of which is provided in the ignition port 141, and a sealing member 147 provided between the ignition port 141 and the ignition electrode 140 and disposed to be spaced apart from the ignition electrode 149.

In an embodiment of the present disclosure, the ignition port 141 is formed to protrude from the reactor body. In detail, the ignition port 141 includes an extension part 141a that protrudes and extends from the reactor body, and a flange 141b provided at an end of the extension part 141a on an opposite side to the reactor body. Here, the extension part 141a is provided in a pipe shape having a specific inner diameter, and a space of a central portion thereof is connected to the reactor body. The flange 141b has a shape that spreads in a direction that is perpendicular to an extension direction of the extension part 141a, that is, an outwardly protruding shape, and may have a disk shape that is opened in correspondence to a spatial portion of a central portion of the extension part 141a.

The ignition electrode 149 may have a stepped shape. In an embodiment of the present disclosure, the ignition electrode 149 includes an electrode body 149a that protrudes long to one side, and a head part 149b that is connected to the electrode body 149a and has a diameter that is larger than that of the electrode body 149a. The electrode body 149a may have a cylindrical shape having a central axis, and the head part 149b may have a cylindrical shape of a specific diameter having the same central axis as that of the electrode body 149a and has a diameter that is larger than that of the electrode body 149a. The head part 149b may have a length that is smaller than that of the electrode body 149a in an extension direction of the electrode body 149a, and the electrode body 149a and the head part 149b may have shape that is similar to a nail as a whole.

In an embodiment of the present disclosure, the ignition electrode 149 is an electrode that is capacitive-coupled to the reactor body 110, and a voltage may be applied to the ignition electrode 149 for gas ignition in the reactor. The ignition voltage, for example, may be applied between the ignition electrode 149 and a reference electrode or between the ignition electrode 149 and the conductive reactor body 110. For example, ignition may be initiated by applying the ignition voltage between the electrode body 149a of the ignition electrode 149, and the extension part 141a of the ignition port 141 that extends from the reactor body 110. One or more ignition electrode 149 may be adjacent to an inner surface or an outer surface of the reactor. The reference electrode may be widely construed in association with one or more electrodes and/or one or more conductors of the reactor, which are operated in cooperation with the one or more ignition electrode 149.

A cover 149c that protects the ignition electrode 149 may be provided on the head part 149b. The cover 149c may be provided in a form that surrounds all of an upper surface and side surfaces of the head part 149b exposed to an outside to cover the entire head part 149b.

At least a portion of the ignition electrode 149 is inserted into a space of a central portion of the extension part 141a having a pipeline shape in the ignition port 141, and for example, the electrode body 149a that protrudes in one direction is inserted into the space of the central portion of the extension part 141a in the ignition port 141. The head part 149b is integrally formed with the main body while not being separated therefrom.

When the ignition electrode 149 is inserted into the ignition port 141, the extension part 141a of the ignition port 141 may surround a circumference of the ignition electrode 149. Here, the extension part 141a surrounds the ignition electrode 149 to be spaced apart therefrom by a specific distance such that an injection space, into which an ignition gas may be injected, is present therebetween. That is, when it is assumed that an inner diameter of the extension part 141a of the ignition port 141 is a first diameter D1 and an outer diameter of the ignition electrode 149 is a second diameter D2, the first diameter D1 may be larger than the second diameter D2.

The ignition electrode 149 may be formed of a metallic material. For example, the ignition electrode 149 may be formed of aluminum. However, the material of the ignition electrode 149 is not limited thereto. Although not illustrated, the ignition electrode 149 may be connected to a power supply part that supplies electric power to primary winding, and may be connected to a separate power supply source.

The sealing member 147 is provided between the ignition port 141 and the ignition electrode 149. The sealing member 147 is adapted to vacuum-encapsulate a space in the ignition port 141, which is connected to the reactor body, from an outside. Because the reactor has to be maintained in a vacuum state to generate plasma, it is important to seal an interior plasma forming space and the igniter 140 of the reactor. The sealing member 147 is provided to enhance sealing performance, and to achieve this, the sealing member 147 may be formed of a ring-shaped elastic material.

In an embodiment of the present disclosure, the sealing member 147 is provided at a location that is spaced apart from the ignition electrode 149 by a specific distance "D". The sealing member 147 is disposed at a circumference of the electrode body 149*a* of the ignition electrode 149 while being spaced apart from the electrode body 149*a* of the ignition electrode 149 by the specific distance "D". Because the sealing member 147 is spaced apart from the ignition electrode 149 unlike a structure, in which it is disposed around a circumference of the ignition electrode 149, damage to the sealing member 147 due to an impact, for example, damage due to heat may be minimized. Because damage to the sealing member 147 is minimized, spaces in the reactor body and the ignition port 141 may be stably encapsulated. Furthermore, because damage to the sealing member 147 due to heat is minimized, particles due to thermal damage to the sealing member 147 and particles due to progress of ignition reactions may be minimized around the igniter 140, and accordingly, ignition efficiency is enhanced.

A plurality of sealing members 147 may be provided according to embodiments, and one of the sealing members 147, which is disposed at a location that is closest to the flange 141*b* of the ignition port 141, in particular, may be located at an arbitrary point on the flange 141*b* of the ignition port 141, which is spaced apart from the ignition electrode 149. Accordingly, damage to the sealing member 147 that is closest to the ignition port 141 due to heat from the ignition electrode 149 may be minimized.

In an embodiment of the present disclosure, a gas supply part 143 may be provided between the ignition electrode 149 and the flange 141*b*. The gas supply part 143 may provide the ignition gas for facilitating ignition to a space of a pipeline form, which is defined by the extension part 141*a*. The gas supply part 143 includes a gas injection hole 143*i* for providing the ignition gas to a space in a pipeline form, and a passage 143*p* that provides the ignition gas from the gas injection hole 143*i* to the space in the pipeline form. A gas supply hole 143*h* is provided at a location of the passage 143*p*, at which the passage 143*p* contacts the space in the pipeline form. One or more gas injection holes 143*i* may be provided, and one or more passages 143*p* ma be provided for the gas injection holes 143*i*.

In an embodiment of the present disclosure, the gas supply hole 143*h* may be disposed at a location that faces an insulation member 145, which will be described below. This is for controlling a flow direction of the gas discharged through the gas supply hole 143*h*. In particular, the gas supply hole 143*h* may be formed such that the gas is injected to an opposite side to a side, in which the flange 141*b* is disposed. The injected gas flows to a space of the reactor body after being reflected on the insulation member 145. As the ignition gas flows in the above-described path, ignition efficiency may be enhanced.

The gas may include various gases, but an inert gas may be used. The inert gas means a gas that has a non-reactivity or has a low reaction speed even when a reaction occurs in many situations. The inert gas, for example, may be one that has a low ionization potential, such as a mixture gas of argon, neon, nitrogen, xenon, radon, krypton, or argon, and oxygen. In an embodiment of the present disclosure, a gas other than inert gases is a reactive gas. The reactive gas means a gas including several species, which tend to participate in one or more chemical reactions. In particular, the reactive gas is a gas of a high reactivity, and may be any one of ions, free radicals, and neutral reaction atoms and molecules.

The ignition gas may be introduced into the plasma chamber and thus decrease a voltage that is necessary when the plasma is ignited.

The insulation member 145 may be provided between the flange 141*b* and the ignition electrode 149, for example, between the gas supply part 143 and the ignition electrode 149, and/or between the flange 141*b* and the gas supply part 143. The insulation member 145 may be provided to insulate between the ignition port 141 and the ignition electrode 149, and an insulation state between the ignition electrode 149 and the ignition port 141 is maintained whereby capacitive coupling therebetween is possible.

Various numbers of insulation members 145 may be provided in a limit, by which the interior space of the reactor may be sealed while the ignition port 141 and the ignition electrode 149 may be effectively insulated and the ignition electrode 149 is supported. For example, the insulation member 145 may be provided between the flange 141*b* of the ignition port 141 and the head part 149*b* of the ignition electrode 149, in detail, between the gas supply part 143 and the head part 149*b* of the ignition electrode 149. The insulation member 145 may have a ring shape, a center of which is opened, and the electrode body 149*a* of the ignition electrode 149 may be inserted into the central opened portion.

A plurality of insulation members 145 may be provided. In an embodiment of the present disclosure, the insulation member 145 may include a first insulation member 145*a* having a ring shape, which directly contacts an outer peripheral surface of the electrode body 149*a*, and an second insulation member 145*b* having a ring shape, a diameter of which is larger than that of the first insulation member 145*a*. The first insulation member 145*a* and the second insulation member 145*b* may be integrally formed and may be formed as separate configurations. When the first and second insulation members 145*a* and 145*b* are formed separately, the first insulation member 145*a* of a ring shape may be disposed on an inner side of the second insulation member 145*b* of a ring shape, and an inner surface of the ring of the second insulation member 145*b* may directly contact an outer surface of the ring of the first insulation member 145*a*.

The insulation member 145 may be formed of a heat-resistant insulation material. For example, the insulation member 145 may be formed of a material, such as ceramic or sapphire. When the plurality of insulation members 145 are provided, the materials of the insulation members 145 may be the same or different. For example, both of the first and second insulation members 145a and 145b may be formed of sapphire, both may be formed of ceramic, and one of them may be formed of sapphire and the other one may be formed of ceramic.

In an embodiment of the present disclosure, it is illustrated that the gas supply part 143 and the insulation member 145 are disposed sequentially from the flange 141b of the ignition port 141 to the ignition electrode 149, but it is apparent that this is an example and some components may be omitted or the sequence may be changed.

As described above, the sealing member 147 for sealing a space in a pipeline form connected to an interior of the reactor from the outside may be provided between the ignition port 141 and the ignition electrode 149, and the plurality of sealing members 147 may be provided. When the plurality of sealing members 147 are provided, the sealing members 147 may be provided between at least one of the ignition port 141 and the gas supply part 143, the gas supply part 143 and the insulation member 145, and the insulation member 145 and the ignition electrode 149. For example, in an embodiment of the present disclosure, the sealing members 147 may include a first sealing member 147a between the ignition port 141 and the gas supply part 143, a second sealing member 147b between the gas supply part and the insulation member 145, and a third sealing member 147a between the insulation member 145 and the ignition electrode 149.

The first sealing member 147a fully seals the flange 141b and the gas supply part 143 to maintain the interior of the reactor in a vacuum state. The second sealing member 147b seals two adjacent components between the gas supply part 143 and the insulation member 145, and/or the third sealing member 147c, between the insulation member 145 and the ignition electrode 149, to maintain the interior of the reactor in a vacuum state. The second and third sealing members 147b and 147c are installed in addition to the first sealing member 147a, and thus a sealed state of the interior of the reactor may be stably maintained even through a portion of the first sealing member 147a is thermally damaged.

Although it is illustrated as an example in an embodiment of the present disclosure that the sealing members 147 are provided between the ignition port 141 and the gas supply part 143, between the gas supply part 143 and the insulation member 145, and between the insulation member 145 and the ignition electrode 149, the present disclosure is not limited thereto, and the sealing members 147 may be provided between one of the ignition port 141 and the gas supply part 143, the gas supply part 143 and the insulation member 145 and the insulation member 145 and the ignition electrode 149, and may be provided two locations or all of three locations.

Because a heat-resistant performance of the igniter of the reactor having the above-described structure, in particular, a heat-resistant performance of the sealing member is enhanced, a vacuum maintaining effect is high. Accordingly, because a heat-resistant performance of the plasma generating device that employs the reactor also is enhanced, durability as well as performance is enhanced.

According to the plasma generating device having the above structure, when the ignition gas is introduced through the gas supply part, electric power is applied to the ignition electrode, and the process gas is introduced into the plasma generating device through an inlet in the interior of the reactor, an electromotive force is transmitted to a plasma discharge channel in the interior of the reactor and thus plasma is discharged. In an embodiment of the present disclosure, the sealing member of the igniter for discharging plasma is installed to be spaced apart from the ignition electrode in the igniter, vacuum destruction due to damage to the sealing member is solved.

According to an embodiment of the present disclosure, the components of the present disclosure may be changed in various forms, and for example, may be manufactured to have shapes and sizes that are different from those of the above-described embodiment.

Referring back to FIGS. 1 and 2, the transformer 150 is installed in the reactor body 110. The transformer 150 provides an inductive electromotive force for generating plasma in the plasma channel forming space in the interior of the reactor body 110. To achieve this, the transformer 150 may include a magnetic core and a primary winding coil that is wound on the magnetic core. The magnetic core may be a ferrite core. A core of the transformer 150 may be disposed in the reactor body 110 to interlink a portion of the plasma discharge channel, and the primary winding coil may be wound on the core.

The power supply part 180 is connected to the winding coil through a wiring line 181. The power supply part 180 may include an RF generator that generates RF electric power, and an RF matcher for impedance matching. The power supply part 180 drives the winding coil by supplying the power source 180 to the winding coil. When the primary winding coil is driven, the plasma discharge channel in the interior of the reactor body 110 functions as secondary winding and thus the plasma may be discharged in the plasma channel forming space. In an embodiment of the present disclosure, the core may define a symmetrical structure that are mounted in one-to-one correspondence to a right side and a left side of a symmetrical structure that branches the gas to opposite sides of the gas injection hole 170. However, the location of the core is not limited thereto.

The collector 120 having the collection space 129 in an interior thereof is connected to the reactor body 110. That is, the reactor body 110 may be directly connected to the collector 120 without any block having a toroidal shape. The collector 120 may be provided to surround the collection space 129.

The collector 120 has openings connected to the branches of the reactor body 110, that is, the first branch 110a and the second branch 110b, and the collection space 129 and the reaction space 130 of the reactor body 110 are directly connected to each other through the openings. The branched branches are connected to the collector 120 while not being joined. Here, the collector 120 may be directly connected to a portion of the reactor of the plasma generating device without any separate outlet 127 in the reactor body 110. A portion of the toroidal reactor is connected to the collector 120, and thus the toroidal channel is expanded to an upper side of the collector 120. In the present embodiment, because the toroidal plasma channel 133 extends to an interior of the collector 120, a portion of the reaction space 130, that is, a space, in which the plasma channel 133 is formed, and a portion of the collection space 129 may overlap each other.

In an embodiment of the present disclosure, to form the plasma channel, a size of a reaction area that overlaps a collection area in the collector 120 may be set variously. For example, the size of the reaction area provided in the collector 120 may be adjusted to a specific size or less in correspondence to an area, in which the transformer 150 (in detail, the core) is mounted, and a non-mounting area.

The collector 120 according to an embodiment of the present disclosure may be provided with a passage guide that is provided in the collection space to change a direction of the passage of the exhaust gas.

Figure 4:
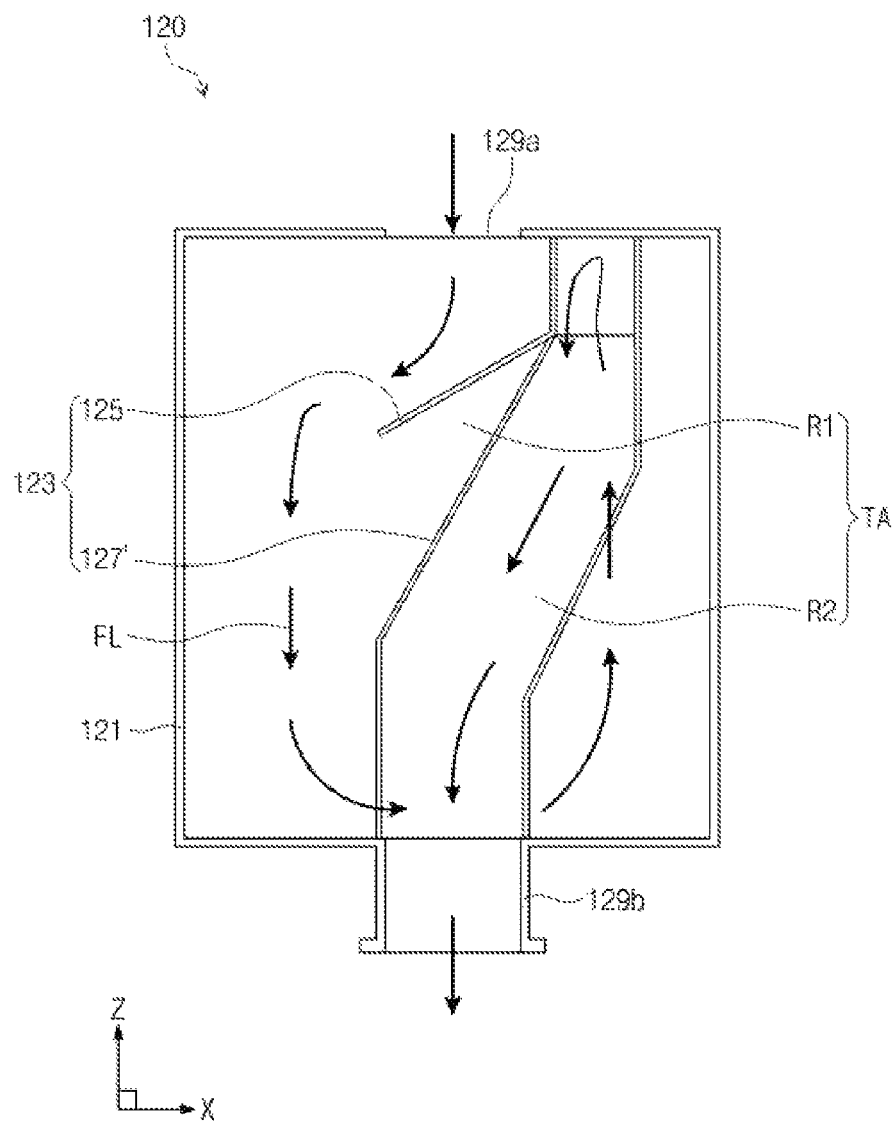
FIG. 4 illustrates a collector according to an embodiment of the present disclosure.

FIG. 4 illustrates the collector 120 according to an embodiment of the present disclosure.

Referring to FIG. 4, the collector 120 according to an embodiment of the present disclosure includes a housing 121 that provides a collection space TA for collecting powder, and the passage guide that is provided in the collection space to change the direction of the passage of the exhaust gas.

The housing 121 includes first and second exhaustion parts 129a and 129b.

Here, the exhaust gas including the powder flows along a passage FL (indicated by an arrow in the drawing) from the first exhaustion part 129a to the second exhaustion part 129b in the housing 121. In an embodiment of the present disclosure, the flow direction of the passage FL is changed in the housing 121 twice or more.

The housing 121 provides the collection space TA to the interior thereof. To achieve this, the housing 121 may be provided to have a hexahedral shape. However, the shape of the housing 121 is not limited thereto, and may be provided in various shapes except for a case, in which the contents thereof are not compatible with contents that will be described below.

The first exhaustion part 129a is provided in the housing of the collector 120 to be connected to the reactor 110, and functions as an inlet, through which gases from the reactor 110 is introduced toward the collector 120. The introduced gas may include powder that is generated due to a phase change of the exhaust gas that reacts with the plasma, and an exhaust gas that does not react. The first exhaustion part 129a may be disposed on one side of the collector 120, for example, on an upper side of the collector 120.

The second exhaustion part 129b is provided in the housing of the collector 120 and is connected to another external configuration, for example, an exhaustion pump. The first exhaustion part 129a functions as an outlet 170b, through which gases in the collector 120 are discharged. The discharged gases may include exhaust gases that do not react, from which the powder is removed. The second exhaustion part 129b may be disposed on an opposite side of the housing 121, which is spaced apart from the first exhaustion part 129a, for example, on lower side of the housing 121.

In an embodiment of the present disclosure, the first and second exhaustion parts 129a and 129b may have overall shapes simply having only openings, and may have a pipe shape that extends in one direction. The shapes of the first and second exhaustion parts 129a and 129b may be changed according to a path, along which the exhaust gas flows in the collector 120. In an embodiment of the present disclosure, when it is assumed that transverse and longitudinal directions with respect to a bottom surface of the collector 120 are the x axis direction and the y axis direction and a height direction is the z axis direction when the collector 120 has a rectangular parallelepiped shape, the second exhaustion part 129b may have a pipe shape that extends in the z axis direction.

The passage guide includes a partition part 123 that partitions the collection space TA into two or more spaces.

The partition part 123 separates a space in the collector 120 into a storage space R1, in which the powder is stored, and a connection space R2 that is communicated with the storage space R1 and provides a path, along which the exhaust gas is discharged to the second exhaustion part 129b.

An opening is formed between the storage space R1 and the connection space R2 such that gases flow therethrough, and the gas flows from the storage space R1 to the connection space R2 through the opening. To achieve this, in an embodiment of the present disclosure, the partition part 123 includes a plate-shaped portion 125 that is disposed to be adjacent to the first exhaustion part 129a in the collector 120 and guides the passage FL of the exhaust gas, and a communication portion 127' that is disposed to be spaced apart from the first exhaustion part 129a while the plate-shaped portion 125 being interposed therebetween.

The plate-shaped portion 125 has a plate shape, and partitions the storage space R1 and the connection space R2 together with the communication portion 127'. At least a portion of the plate-shaped portion 125 may be inclined with respect to the z axis, and may guide the passage FL such that the passage FL is formed downwards in the storage space R1. The plate-shaped portion 125 may guide the passage FL such that the passage FL is formed upwards at a portion of the connection space R2. Here, the plate-shaped portion 125 may be formed to have the same width as an internal width of the collector 120, and for example, may be formed to be smaller than the internal width of the collector 120 such that portions of the storage space R1 and the connection space R2 are connected to each other at a lower side thereof.

The communication portion 127' may have a shape of a pipeline, and an upper end thereof may be opened and a lower end thereof may be connected to the second exhaustion part 129b. The opened upper end of the communication portion 127' may be provided at a location that is higher than the opening formed between the storage space R1 and the connection space R2 in the z axis direction. The exhaust gas flows to the communication portion 127' through the opened at the upper end of the communication portion 127'. Accordingly, the exhaust gas may flow along the passage FL that descends toward the second exhaustion part 129b on a lower side.

In an embodiment of the present disclosure, although it is illustrated as an example that the communication portion 127' has a four-sided cross-sectional shape when being cut in a direction that is perpendicular to the z axis, the present disclosure is not limited thereto, and it is apparent that it may have a circular cross-section, an elliptical cross-section, or other shapes.

Figure 5A:
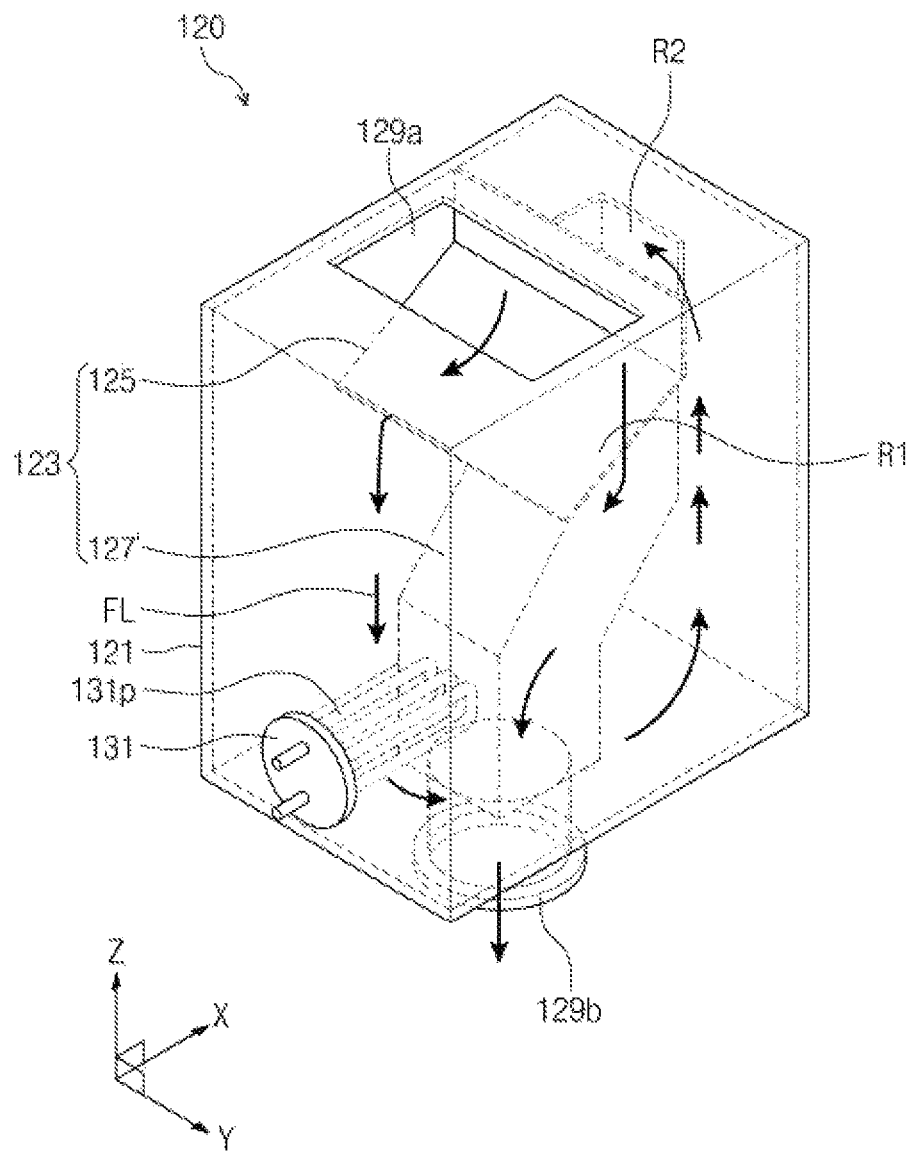
FIG. 5A is a perspective view of a collector according to an embodiment of the present disclosure.
Figure 5B:
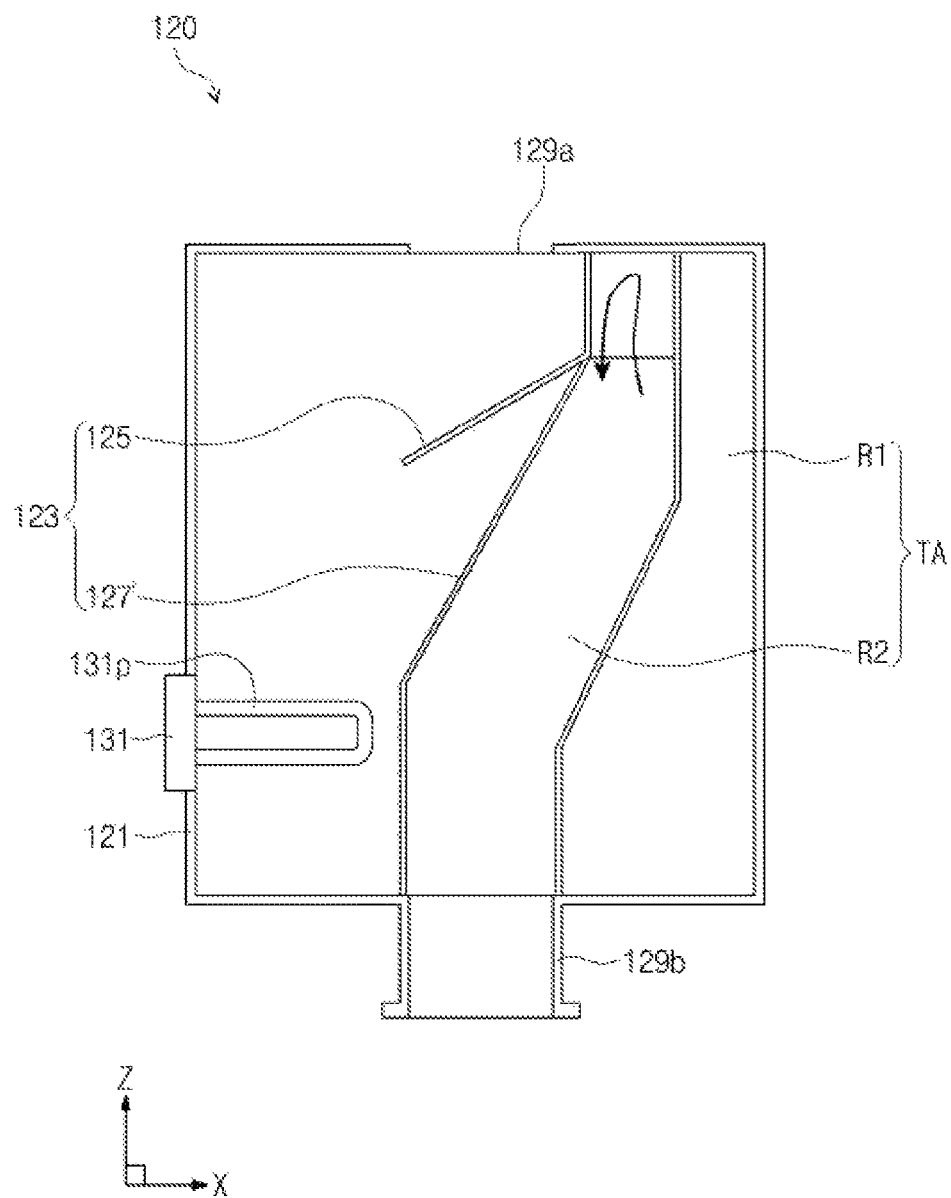
FIG. 5B is a side cross-sectional view of a collector according to an embodiment of the present disclosure.

FIG. 5A is a perspective view of the collector according to an embodiment of the present disclosure, and FIG. 5B is a side cross-sectional view of the collector according to an embodiment of the present disclosure.

Referring to FIGS. 5A and 5B, a cooling part 131 that cools the exhaust gas may be installed in an interior of the collector 120. In the present embodiment, for convenience of description, the collector 120, in which the communication portion 127' is installed, will be described as an example in the above-described embodiment, and it is apparent that the cooling part 131 may be installed in other forms of collectors.

The cooling part 131 is disposed in the collection space TA, and in particular, is disposed in a path, along which the exhaust gas injected through the first exhaustion part 129a flows, in the collection space TA.

The cooling part 131 may include a pipeline 131p, and a cooling fluid provided into the pipeline 131p. Various numbers of pipelines 131p may be provided at various locations such that temperature may be lowered in the interior space of the collector 120, in particular, in the storage space R1, in the interior of the collector. In an embodiment of the present disclosure, two cooling parts 131 on the passage of the exhaust gas are illustrated as an example.

The pipeline 131p of the cooling part 131 may be provided in the collection part to have a U shape, but the present disclosure is not limited thereto. It is sufficient as long as the pipeline 131p is disposed on the passage, in which the exhaust gas flows, such that a temperature of the exhaust gas is efficiently lowered, and the present disclosure is not limited to the shape. For example, the pipeline may have an M shape.

In an embodiment of the present disclosure, a length of the pipeline 131p of the cooling part 131 may be various. For example, the length of the pipeline 131p of the upper cooling part 131 may be larger, and the length o/f the pipeline 131p of the lower cooling part 131 may be shorter. The length of the pipeline 131p may be variously set according to a shape of the interior space of the collector 120, a shape and a disposition location of the partition part 123, the passage of the exhaust gas, and the like.

In an embodiment of the present disclosure, the cooling fluid is a fluid that is provided at a low temperature and may absorb heat in an adjacent area, and is not specifically limited, and for example, may be a fluid such as water, a refrigerant, and the exhaust gas.

In the present embodiment, because the temperature of the exhaust gas is lowered by the cooling part, the powder is easily collected.

In an embodiment of the present disclosure, although it is illustrated that the cooling part is formed in the interior of the collector in the embodiment, the present disclosure is not limited thereto. The cooling part for lowering the temperature in the interior of the collector also may be formed outside the collector.

In an embodiment of the present disclosure, the cooling part 131 is detachable from the collector 120, and a part, to which the cooling part 131 is provided, may be used as a cleaning port for cleaning the interior of the collector 120 when the cooling part 131 is removed.

Figure 6:
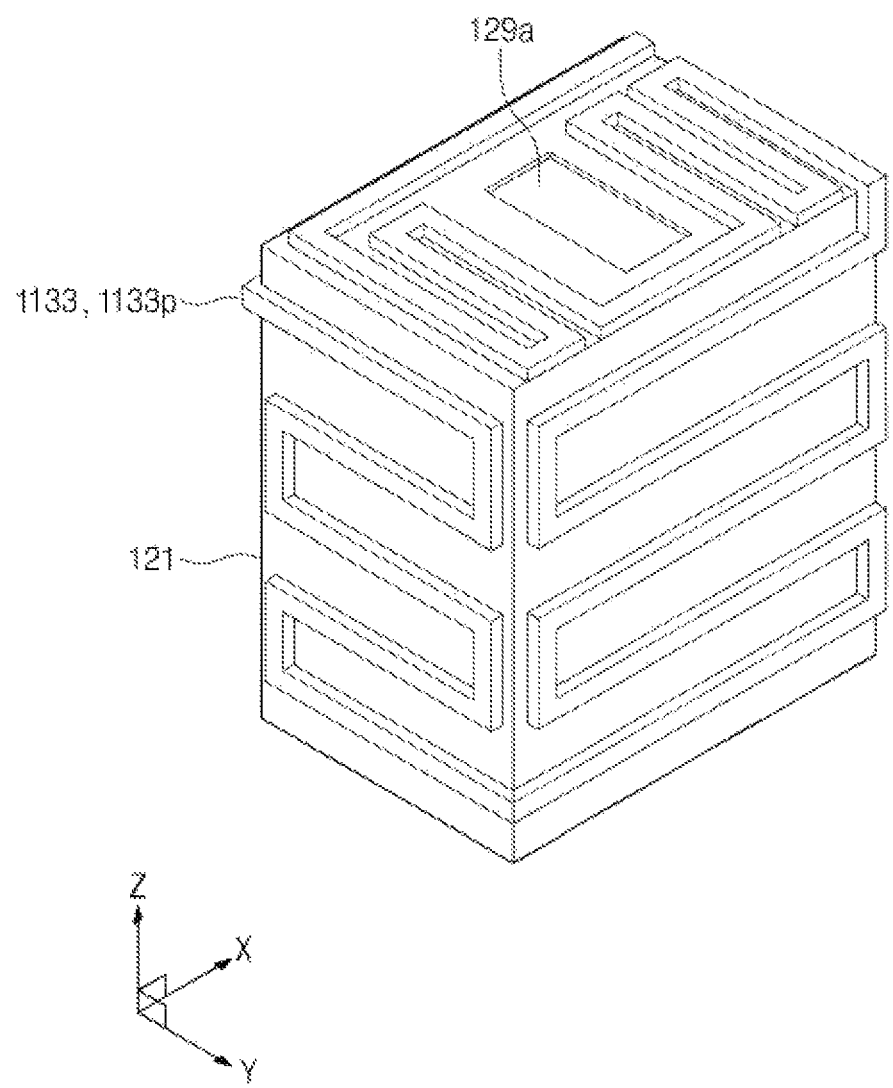
FIG. 6 is a perspective view of a collector according to an embodiment of the present disclosure, and is a view illustrating that a cooling part is formed outside the collector.

FIG. 6 is a perspective view of the collector according to an embodiment of the present disclosure, and is a view illustrating that the cooling part is formed outside the collector.

According to an embodiment of the present disclosure, the cooling part may be installed on an outer surface of the housing 121. When it is assumed that the cooling part 131 disposed in the collection space of the housing 121 is the first cooling part 131 and the cooling part outside the collection space TA, that is, on an outer surface of the housing 121 is a second cooling part 1133, the second cooling part 1133 may include a pipeline 1133p and a cooling fluid in an interior thereof. A single or a plurality of pipelines 1133p may be provided.

The second cooling parts 1133 may be provided on the outer surface of the housing 121 at a specific interval to uniformly provide cooling air to the inner collection space TA on the outer surface of the housing 121. For example, the pipelines 1133p that constitute the second cooling part 1133 may extend to be disposed in a zigzag form and the adjacently disposed pipelines 1133p may have a uniform interval as a whole. However, the pipelines 1133p of the second cooling part 1133 may be differently disposed if necessary. For example, the pipelines of the second cooling part 1133 may be disposed in an area that is close to the storage space R1 at a relatively high density.

In the present embodiment, it is illustrated that the pipelines 1133p have a rectangular cross-section with respect to an extension direction thereof, but this illustration is an example. The cross-sections of the pipelines 1133p may have various shapes, such as a circle, an ellipse, a semicircle, and other polygonal shapes.

In the above-described embodiments, although it is illustrated that the cooling parts 1133 and 1133p are formed in the interior of the collector 120 and outside the collector 120, they may be formed on the inside and the outside of the collector 120 in an embodiment of the present disclosure.

The plasma generating device according to the above-described embodiment of the present disclosure may be used for a semiconductor process and the like. In particular, the reactor, and/or the plasma generating device including the same according to an embodiment of the present disclosure may be used for treatment of exhaust gases generated during the process.

Figure 7:
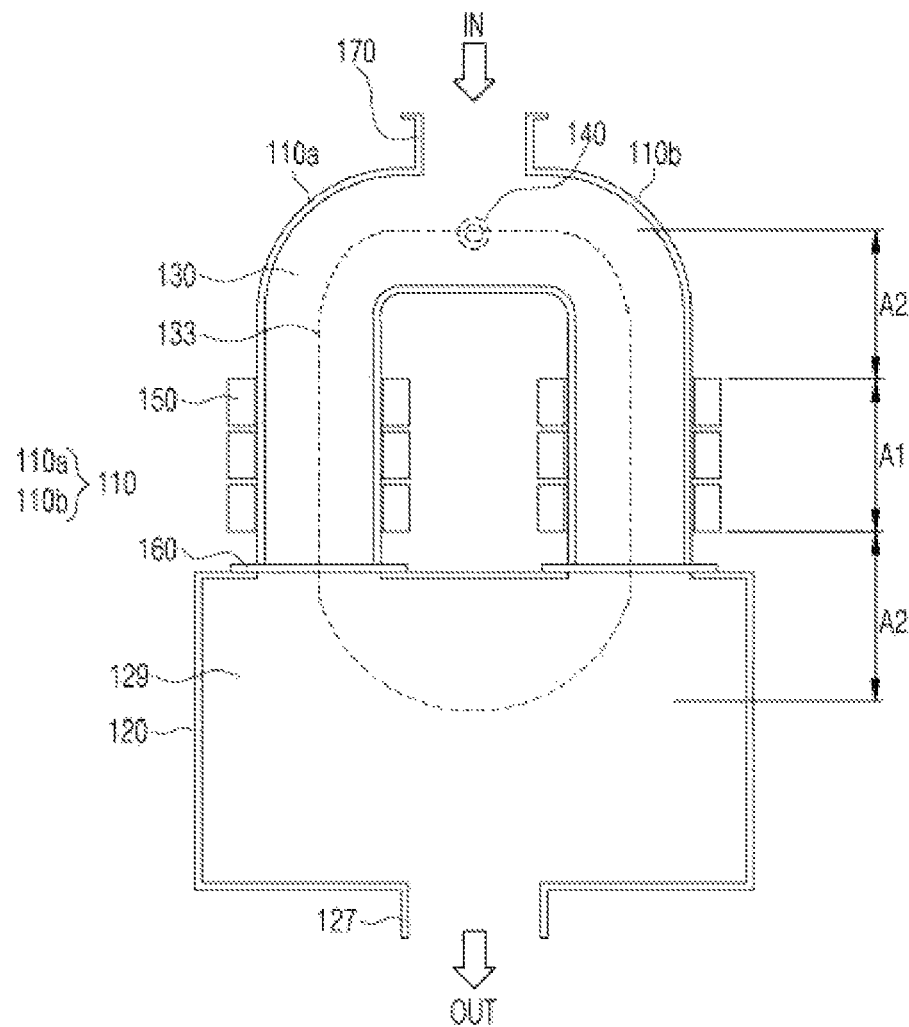
FIG. 7 is a plan view illustrating a transformer mounting area and a non-mounting area in an area, in which a plasma channel is formed.

FIG. 7 is a plan view illustrating the transformer mounting area and the non-mounting area in an area, in which the plasma channel is formed.

Referring to FIG. 7, the area, in which the plasma channel is formed, includes a magnetic core mounting area A1 of the transformer, and an area A2, in which the magnetic core is not mounted.

In an embodiment of the present disclosure, a length of the plasma channel 133 in the reaction area in the collector 120 may be a ratio of about 50% or less of a length of a channel of the area A1, in which the magnetic core of the transformer 150 is mounted. In the present embodiment, for convenience of description, the plasma channel 133 is indicated in a form of a line that connects points of the highest concentrations of plasma on a cross-section in an area, in which the plasma channel 133 is formed. The plasma channel 133 in the interior of the reactor body 110 is an imaginary line that connects points (or example, the center on the toroidal cross-section) of the highest concentrations of plasma on the toroidal cross-section of the reactor body 110, and the plasma channel 133 in the reaction area in the collector 120 is a line that is continuous to the plasma forming space in the reactor body 110 and connects portions of highest concentration of plasma on a cross-section in the collector 120.

Referring back to FIGS. 1 and 2, the collector 120 receives exhaust gas plasma energy and collects powder in a solid state when the process by-product are generated as the powder. Some process by-product may be decomposed into gas phases through plasma treatment and then may be discharged.

An exhaust pump (not illustrated) that discharges the exhaust gas after the powder is collected by the collector 120 and converts the interior of the chamber into a vacuum state may be installed on one side of the collector 120.

The exhaust gas includes the process by-product that are generated while a process is progressed or are introduced while not reacting from a process chamber 20, while a process is progressed, but the kinds thereof are not limited thereto. The process by-product included in the exhaust gas, for example, may include perfluorocompounds, precursors (Zr-precursor, Si-precursor, Ti-precursor, Hf-precursor, and the like), $TiCl_4$, $WF_6$, $SiH_4$, $Si_2H_6$, $SiH_2Cl_2$, $NF_3$, $NH_3$, $NH_4Cl$, $TiO_2$, $WN$, $ZrO_2$, and $TiN$.

Accordingly, the plasma generating device according to an embodiment of the present disclosure includes the collector and thus provides gases obtained by treating the process by-product included in the exhaust gas after the exhaust gas undergoes the process chamber 20, and thus, a life span of the exhaustion pump may be prolonged while not badly influencing the exhaustion pump.

In an embodiment of the present disclosure, an outlet 127, through which the gas that underwent the plasma channel forming space and the collection space 129 is discharged to the outside, is installed in the collector 120.

The outlet 127 is spaced apart from a connection part between the reactor body 110 and the collector 120 and is provided in an outwardly opened form. In an embodiment of the present disclosure, it is illustrated on the drawing as an example that the gas injection hole 170 is provided on an upper side of the reactor body 110, and the outlet 127 is provided on a lower side of the collector 120.

In an embodiment of the present disclosure, one end of the gas injection hole 170 and an opposite end of the outlet 127 may be connected to other additional components that constitute the plasma generating device, and for example, the one end of the gas injection hole 170 may be connected to an upper adapter and the opposite end of the outlet 127 may be connected to a lower adapter. In an embodiment of the present disclosure, a flow direction of the gas at the outlet 127 is indicated by OUT.

In an embodiment of the present disclosure, an inner wall of the gas injection hole 170 may extend to an inside of the reactor body.

Figure 8:
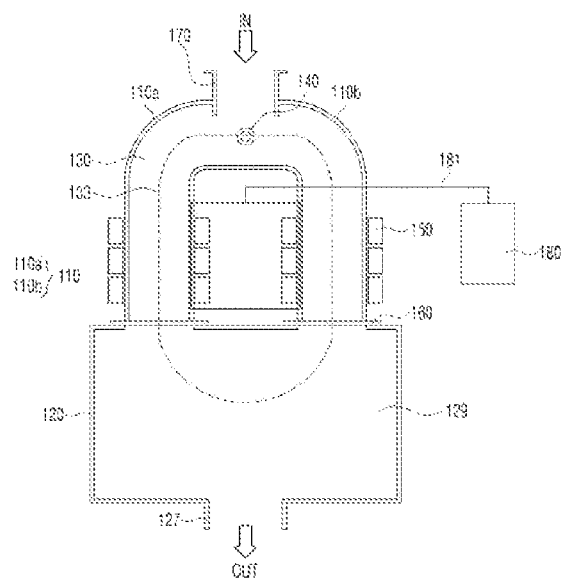
FIG. 8 is a cross-sectional view illustrating a plasma generating device according to an embodiment of the present disclosure.

FIG. 8 is a cross-sectional view illustrating the plasma generating device according to an embodiment of the present disclosure.

Referring to FIG. 8, the inner wall of the injection hole may extend into the plasma channel space of a plasma main body.

In an embodiment of the present disclosure, a connector may be connected to one end of the gas injection hole.

Figure 9A:
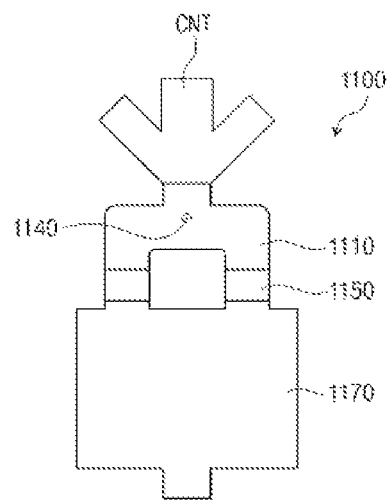
FIG. 9A illustrates a plasma generating device, to which a connector is connected.
Figure 9B:
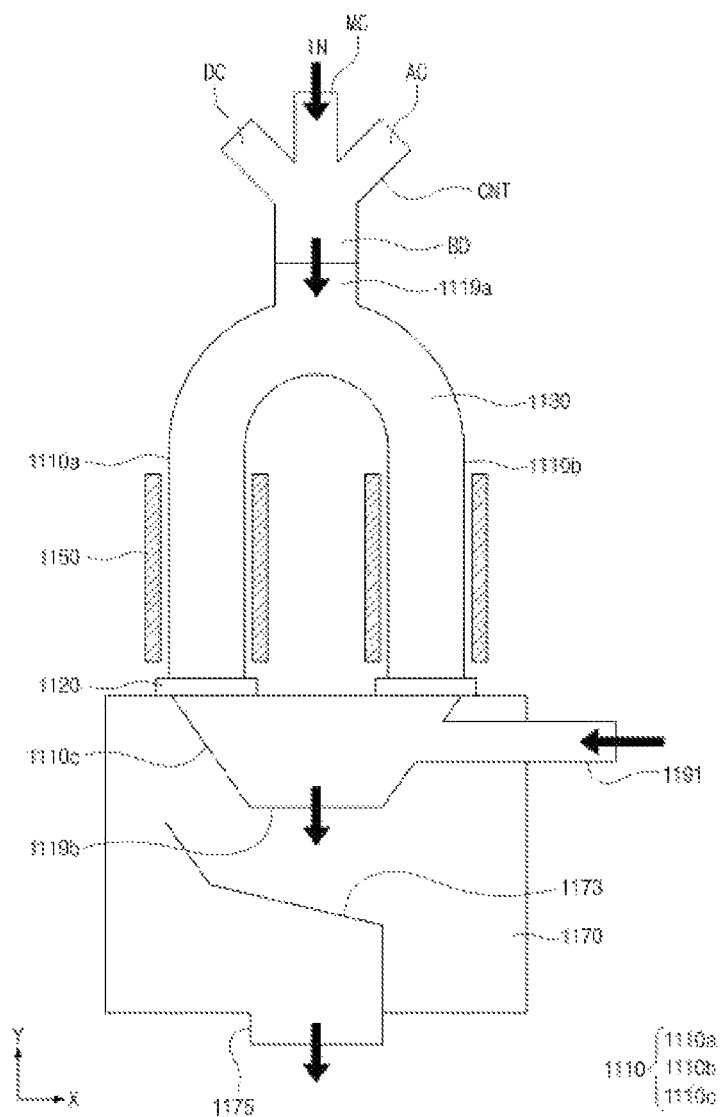
FIG. 9B illustrates a plasma generating device according to an embodiment of FIG. 9A in detail.

FIG. 9A illustrates the plasma generating device, to which the connector is connected, and FIG. 9B illustrates the plasma generating device according to an embodiment of FIG. 9A in detail.

Referring to FIGS. 9A and 9B, one end of a connector CNT is connected to an injection hole 1119*a*, and has a plurality of openings that are communicated with the interior of the reactor. The plurality of openings may be injection holes for gases and may be for maintenance and repair.

In an embodiment of the present disclosure, one or more of the plurality of openings, for example, two openings may be used as injection paths for gases. In an embodiment of the present disclosure, the connector CNT includes a connector main body BD, one side of which his connected to the injection hole, a main injector hole MC, which is connected to an opposite side of the connector main body BD and through which the process by-product are injected, and an auxiliary injection hole AC, which is connected to an opposite side of the connector main body BD and through which additional gases such as ozone are injected. To achieve this, the connector CNT according to an embodiment of the present disclosure may be provided in a form having at least two inlets, and both of the two inlets may be used as injection holes for gases. When the connector CNT has two inlets, one of them may be the main injector hole MC and the remaining one may correspond to the auxiliary injection hole AC.

In an embodiment of the present disclosure, the process by-product are provided to a reactor 1110 of a plasma generating device 1100 from the process chamber 20, through the main injector hole MC of the connector CNT. The additional gases react with the plasma and the process by-product, and may be ozone gas and/or an organic compound (for example, an organic compound including a methyl group).

The plasma generating device 1100 provides plasma energy and/or purification gases to the process by-product to burn or purify harmful substances of the process by-product. Ones that expedite a reaction or react together when a material, such as powder, is obtained in a process of harmful substances of the process by-product reacting with plasma may be selected as the additional gases. The process by-product generated in the process chamber through a deposition process include a metal precursor, a nonmetal precursor, and process by-product, and by-product of a cleaning gas.

In an embodiment of the present disclosure, the connector CNT may further include a maintenance/repair opening DC connected to the connector main body BD. In this case, in an embodiment of the present disclosure, the connector CNT may be a 3-hole connector to have the main injector hole MC, the auxiliary injection hole AC, and the maintenance/repair opening DC. In the 3-hole connector, one may be the main injector hole MC, another one may be the auxiliary injection hole AC, and the remaining one may be the maintenance/repair opening DC. Here, when the 3-hole connector CNT is provided, the main injector hole MC may be a middle one of the three holes, and the auxiliary injection hole AC and the maintenance/repair opening DC may be disposed on opposite sides of the main injector hole MC. For example, in an embodiment of the present disclosure, the maintenance/repair opening DC may be provided at a location that is symmetrical to the auxiliary injection hole AC while the main injector hole MC being interposed therebetween. However, the location of the maintenance/repair opening DC is not limited thereto. However, the locations and the shapes of the main injector hole MC, the auxiliary injection hole AC, and the maintenance/repair opening DC are not limited thereto, and may be changed to various locations and shapes. In an embodiment of the present disclosure, the main injector hole functions as an inlet, through which the process by-product are mainly injected, but it is not necessary to inject only conditional process by-product through the main injector hole and a mixture of the process by-product and additional gases may be injected according to occasions.

The maintenance/repair opening DC according to an embodiment of the present disclosure may be for cleaning the reactor 1110. In this way, according to an embodiment of the present disclosure, because the separate auxiliary injection hole AC is installed in addition to the main injector hole MC for injecting the process by-product or additional gases to easily inject the additional gases into the reactor 1110, a plasma reaction and/or a powder generating reaction occur more effectively. Furthermore, according to an embodiment of the present disclosure, because a separate cleaning dummy injecting part 1171 is installed in the connector, foreign substances, such as powder, that are stacked in the connector CNT and the interior of the reactor 1110, in particular, on an upper side of the reactor 1110 may be easily cleaned effectively for a short time. Through this, according to an embodiment of the present disclosure, a maintenance/repair time may be reduced and maintenance costs also may be reduced.

Referring to FIG. 9B, the plasma generating device 110 may include the reactor 1110, the injection hole 1119*a*, an outlet 1119*b*, the connector CNT, and a collector 1170.

The collector 1170, as illustrated in FIG. 9B, may not be connected to an outlet 1170*b* but may be directly connected to a portion of the reactor 1110. In the present embodiment, a portion of the toroidal reactor is connected to the collector 1170 while an insulator 1120 being interposed therebetween such that the toroidal channel is formed in the collector 1170. The collector 1170 may be connected to branches of the reactor 1110, that is, a first branch 1110a and a second branch 1110b. The branched branches may be connected to the collector 1170 while not joined, and may be joined in the collector by an exit housing 1110c in the collector 1170. An upper part of the exit housing 1110c is connected to the first and second branches of the reactor, and a lower part thereof is an outlet and may have an opened rectangular funnel shape.

In the present embodiment, because the toroidal plasma channel extends into the collector 1170, it may burn, decompose, and purify even the process by-product in the collector 1170.

Accordingly, the above-described process by-product treating apparatus is one of process executing apparatuses, and includes the plasma generating device 110 and the collector 1170 connected to the plasma generating device 110 to provide the gases obtained by treating the process by-product after undergoing the process chamber 20, and thus, a life span of the exhaustion pump may be prolonged while the exhaustion pump is not badly influenced.

The plasma generating device 110 according to an embodiment of the present disclosure may be used for the purpose of treating the process by-product that are used in a post operation of a process performed in the process chamber 20 and exit from the process chamber 20.

In an embodiment of the present disclosure, because the exit housing 1110c is present as a portion of the reactor 1110, a density of the plasma in a plasma forming space 1130 in the interior of the reactor 1110 may be maintained at a desired level. In the reactor 1110, it is necessary to maintain the plasma such that a reaction of the plasma and the gases may occur sufficiently, and the exit housing 1110c causes the plasma forming space to have a closed loop shape while the plasma forming space is expanded to the interior of the collector 1170. In particular, a lower side leaning phenomenon of the plasma may be caused by the gravitational force even in the reactor 1110, and a reaction with the gases at a lower portion of the reactor 1110 may be optimized as the exit housing 1110c is provided.

In an embodiment of the present disclosure, a separate additional injection pipeline 1191 for additionally injecting additional gases related to the reaction of the plasma and the process by-product may be installed in the exit housing 1110c. The additional injection pipeline 1191, for example, may provide ozone (O2) gas and/or organic compounds (for example, methyl group containing organic compounds) to the plasma forming space 1130 in the interior of the reactor 1110, through an outlet. The kinds of the injected additional gases are not limited thereto. The additional gases provided through the additional injection pipeline may be substantially the same as additional gases provided through the auxiliary injection hole AC of the connector CNT. However, in an embodiment of the present disclosure, the kinds of the additional gases provided through the additional injection pipeline may be different therefrom.

An area, in which the exit housing 1110c is provided, is an area, in which the density of the plasma generated in the reactor is relatively high, and a decomposition reaction of the process by-product may be enhanced further by providing the additional gases to the area. For example, due to bonding of zirconium-based process by-product and the ozone gas, a reaction of generating zirconium oxide powder may be accelerated. This is because a lower portion of the reactor 1110, to which the exit housing 1110c is provided, is, among portions of the reactor 1110, a portion that is close to the exhaustion pump connected to the collector 1170 and thus the density of the plasma is high due to a pulling force by the exhaustion pump.

Although not illustrated in the drawings in detail, it is difficult to directly couple an ozone port of the additional gas injection pipeline 1191 connected to the exit housing 1110c to the rectangular funnel when the exit housing 1110c has a rectangular funnel shape, and thus opposite sides of the additional gas injection pipeline 1191 may have opened shapes. An opening may be formed on a side surface of the rectangular funnel such as the additional gases, such as ozone, may enter the rectangular funnel, and the additional gas injection pipeline may be connected to the opening having the shape in a linear or curved form. The opening may have various shapes, for example, a circular shape, and the additional gas injection pipeline may be curved in an "S" shape.

In the present embodiment, because the toroidal plasma channel 133 extends to an interior of the collector 1170, a portion of the reaction space 1130, that is, the space 1130, in which the plasma channel 133 is formed, and a portion of the collection space 1171 may overlap each other. In an embodiment of the present disclosure, the exit housing 1110c may be provided in the collector 1170 to form the plasma channel, and a size of the space 1130 for forming the plasma channel may be variously adjusted by adjusting a size of the outlet provided in the exit housing.

The collector 1170 may include a guide member 1173 that is provided in the collection space 1171 and divides the collection space 1171 to two or more parts. The guide member 1173 may have a plate shape or be an exhaust line in a pipe form. A direction of the passage for the gases that travels into the collector 1170 may be changed by the guide member 1173 at least twice.

In an embodiment of the present disclosure, a collector outlet 1175, through which, after a reactant of the process by-product are collected, the remaining gases are discharged, is provided in the collector 1170. The collector outlet 1175 may be disposed at a lower portion of the collector 1170, that is, on a bottom surface of the housing.

In FIGS. 9A and 9B, reference numerals 1140 and 1150, which have not been described, are the igniter and the transformer.

In an embodiment of the present disclosure, the collector does not necessarily need to be provided or does not necessarily need to have the same shape as illustrated even though it is provided. The collector may be omitted or implemented in different forms according to situations.

Referring back to FIGS. 1 and 2, in an embodiment of the present disclosure, an insulator 160 may be provided between the reactor body 110 and the collector 120. The insulator 160 is to prevent induced currents from flowing to the reactor body 110 and/or the collector 120 when the reactor body 110 and/or the collector 120 are formed of a conductive material, and is provided for electrical insulation.

The insulator 160 have a ring shape corresponding to a circular shape in a toroidal cross-section. In an embodiment of the present disclosure, the insulators 160 may be provided between the branches of the reactor body 110 and the collector 120, but the number and mounting locations thereof may be changed. For example, the insulators 160 may be disposed in an asymmetrical shape with respect to a specific line or surface on the reactor body 110. In addition, when the reactor body 110 has a plurality of bodies, for example, two or more bodies, the insulators 160 may be provided between respective adjacent two bodies.

In an embodiment of the present disclosure, the insulator 160 may be provided at least one of between bodies constituting the reactor body 110, and between the reactor body 110 and the collector 120.

In an embodiment of the present disclosure, an insulator 2120 may have various shapes.

FIGS. 10A to 10E illustrate cross-sectional views of the insulator 2160 according to an embodiment of the present disclosure.

Figure 10A:
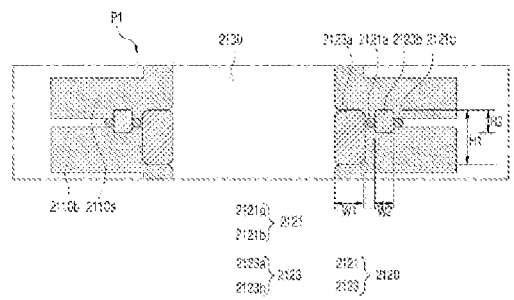
FIGS. 10A to 10E illustrate cross-sectional views of an insulator according to an embodiment of the present disclosure.
Figure 10B:
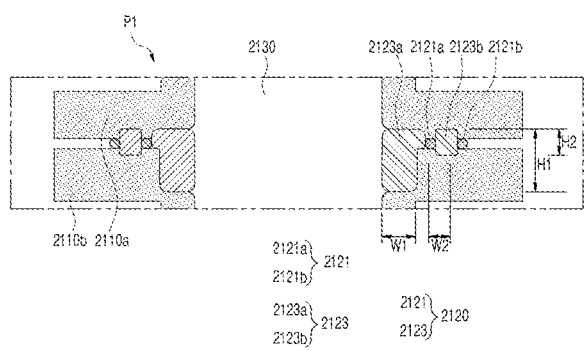
Figure 10C:
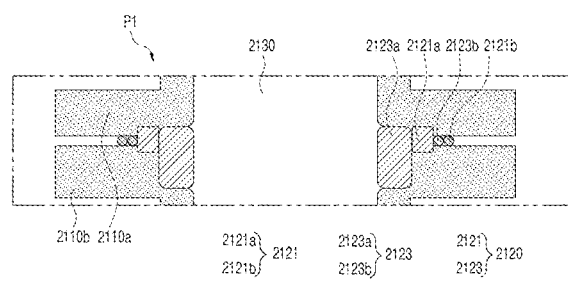
Figure 10D:
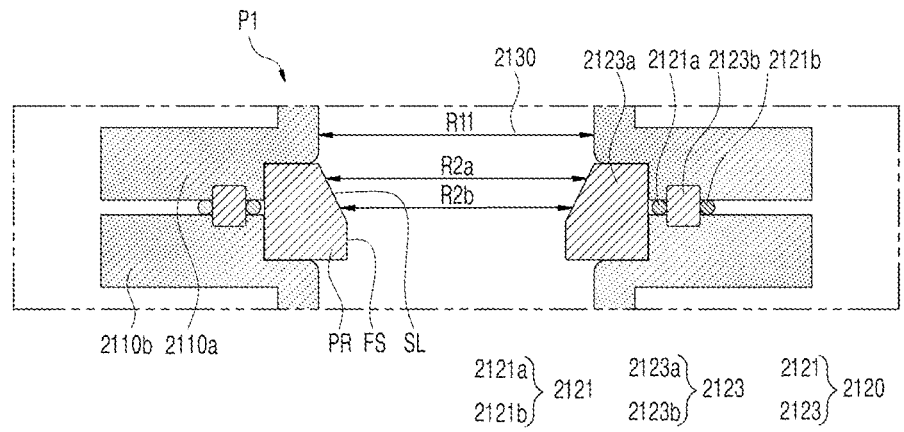
Figure 10E:
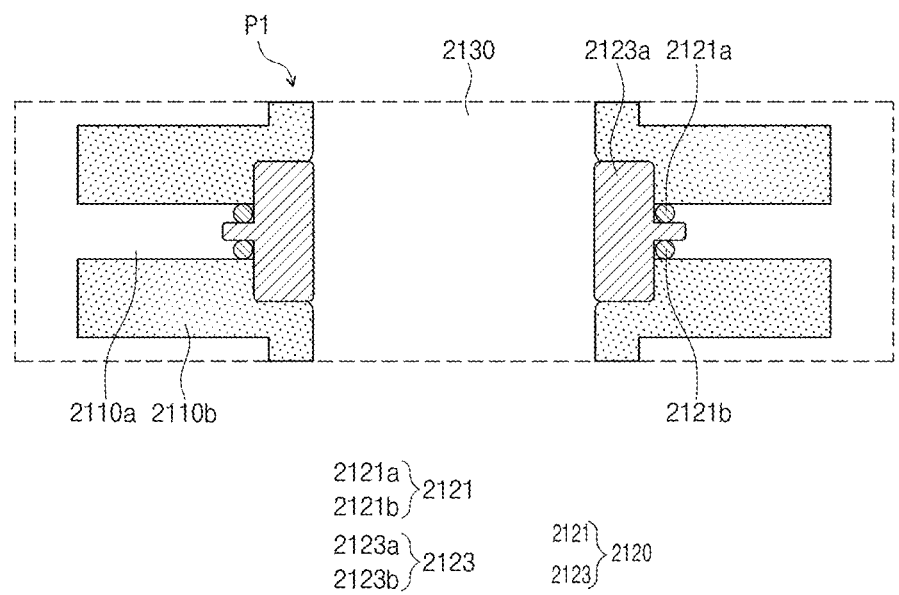

First, referring to FIGS. 10A and 10E, an insulator 2120 includes at least two sealing members 2122 that seal a plasma channel forming space 2130 while spacing a first body 2110a and a second body 2110b apart from each other.

In an embodiment of the present disclosure, the first body 2110a and the second body 2110b have a flange structure that protrudes outwards from an area, in which the insulator is disposed. Because the first body 2110a and the second body 2110b have the flange structure, the sealing members may be installed at points that are spaced outwards apart from an inside of the reactor body that defines the plasma channel forming space 2130. The plasma channel forming space 2130 of the reactor body is maintained at a high temperature according to processes in many cases, and the sealing members may be prevented from being damaged due to heat as the sealing members are spaced apart from a high-temperature area through the flange structure. Furthermore, because ends of the first body 2110a and the second body 2110b have the flange structure, the cooling part for cooling the sealing members also may be installed to be spaced apart from the plasma forming space 2130 of the reactor body thereafter. Accordingly, a temperature of the plasma forming space 2130 formed by the reactor body may be prevented from being lowered by spacing the cooling parts that is necessary for cooling the sealing members. In other words, the sealing members may be cooled while a temperature of the reactor body that is adjacent to the plasma forming space 2130 is maintained. The cooling part will be described later.

According to an embodiment of the present disclosure, the sealing members 2121 may be provided along outskirts of the first body 2110a and the second body 2110b between the first body 2110a and the second body 2110b, and accordingly, they have a closed shape. That is, the sealing members 2121 have ring shapes corresponding to the outskirts of the first body 2110a and the second body 2110b. The sealing members 2121 are for sealing the interior space 2130 defined by the first body 2110a and the second body 2110b from the outside, between the first body 2110a and the second body 2110b. The sealing members 2121 are pressed between the first body 2110a and the second body 2110b to fully seal the interior of the reactor from the outside. Accordingly, the interior of the reactor of the plasma generating device 210 may be maintained in a vacuum state by the sealing members 2121.

The sealing members 2121 may be formed of an elastic material to effectively seal the interior of the reactor between the first body 2110a and the second body 2110b. Furthermore, the sealing members 2121 may be formed of a heat-resistant material that is stable at the high temperature of the reactor. In an embodiment of the present disclosure, the sealing members 2121 may be formed of a polymeric resin that is elastic and has a heat-resistant property. For example, the sealing member 2121 may be formed of a silicon resin.

A plurality of sealing members 2121 may be provided. As the plurality of sealing members 2121 are provided, the interior of the reactor may be stably sealed from the outside even when the sealing members 2121 are damaged. Furthermore, according to an embodiment of the present disclosure, the sealing members may be disposed at various locations. For example, the sealing members may be sequentially disposed along a first direction that faces an outside from an inside of the reactor body, or are sequentially disposed along a second direction that is perpendicular to the first direction.

It is assumed that two sealing members 2121 are provided and are called a first sealing member 2121a and a second sealing member 2121b, respectively, the first sealing member 2121a and the second sealing member 2121b may be sequentially disposed in an outward direction from the interior of the reactor. For example, when the second sealing member 2121b has a ring shape, an inner diameter of the ring may be larger than an inner diameter of the first sealing member 2121a, and the second sealing member 2121b may be disposed outside the first sealing member 2121a. In this case, even though the inner first sealing member 2121a is damaged by the plasma in the interior of the reactor or is exposed to heat to be damaged, the interior of the reactor may be consistently maintained in a vacuum state by the second sealing member 2121b.

In an embodiment of the present disclosure, diameters in cross-sections of the first sealing member 2121a and the second sealing member 2121b are the same, but the present disclosure is not limited thereto. When an interval between the first body 2110a and the second body 2110b is constant, the diameters in the cross-sections of the first sealing member 2121a and the second sealing member 2121b may be the same, but the diameters in the cross-sections of the first sealing member 2121a and the second sealing member 2121b may have different values when the interval between the first body 2110a and the second body 2110b has different values in the areas, in which the first sealing member 2121a and the second sealing member 2121b are provided respectively.

In an embodiment of the present disclosure, the insulator 2120 may further include an insulation member 2123 that prevents damage to the sealing member 2121 due to the plasma and/or thermal damage thereto. In particular, the insulation member 2123 prevents the sealing members 2121 from being damaged by the heat generated when the plasma in the interior of the reactor is formed such that the interior vacuum of the reactor is destructed. The insulation member 2123 may prevent a short-circuit and an arc in an insulation section as well as may prevent thermal damage to the sealing members 2121. When particles generated when the plasma generating device 210 is driven are stacked between the first body 2110a and the second body 2110b, a short-circuit and an arc may be generated between the first body 2110a and the second body 2110b due to the particles, and because the insulation member 2123 is disposed between the first body 2110a and the second body 2110b, the short-circuit and the arc may be reduced by sufficiently spacing the first body 2110a and the second body 2110b apart from each other.

First of all, the insulation member 2123 prevents the sealing members 2121 from being damaged by the plasma by preventing the plasma in the interior of the reactor from being exposed by the sealing member 2121. The insulation member 2123 may be formed of a material that is not elastic, and for example, may be formed of a heat-resistant material such as ceramic. Furthermore, the insulation member 2123 is formed of a nonconductive material, and electrically insulates the first body 2110a and the second body 2110b from each other. Furthermore, the insulation member 2123 also thermally insulates them from peripheral components.

The insulation member 2123 has a closed ring shape, and insulates the first body 2110a and the second body 2110b from each other. Furthermore, the insulation member 2123 may protect the sealing members 2121 from the plasma in the interior of the reactor and heat at a location that is adjacent to the sealing members 2121.

At least one insulation member 2123 may be provided. In an embodiment of the present disclosure, two insulation members 2123 may be provided. The number of insulation members 2123 may be variously set, but in an embodiment of the present disclosure, two insulation members 2123, that is, a first insulation member 2123a and a second insulation member 2123b will be described as an example.

The plurality of insulation members 2123 may have different sizes. Sizes of the plurality of insulation members 2123 may be variously set for at least one of functions of effectively spacing the first body 2110a and the second body 2110b apart from each other and insulating them from each other, and effectively protecting the sealing members 2121 from the plasma in the interior of the reactor and a high temperature. In an embodiment of the present disclosure, when the first insulation member 2123a and the second insulation member 2123b are disposed from the inside of the reactor, the first insulation member 2123a may have a size that is larger than that of the second insulation member 2123b. Because the first insulation member 2123a has the larger size, an interval of the first body 2110a and the second body 2110b may be maintained, and the first insulation member 2123a may function to primarily protect the sealing member 2121 disposed on an outside of the insulation member 2123.

In an embodiment of the present disclosure, a diameter of a cross-section of the first insulation member 2123a and a diameter of a cross-section of the second insulation member 2123b may have specific values. For example, a minimum diameter of the cross-section of the first insulation member 2123a may be about two to nine times as large as a minimum diameter of the cross-section of the second insulation member 2123b, and a maximum diameter of the cross-section of the first insulation member 2123a may be about one to three times as large as a maximum diameter of the cross-section of the second insulation member 2123b. (Here, a diameter of a cross-section means a cross-section of a ring when the ring is cut by a plane that is perpendicular a plane defined of the ring of the ring-shaped insulation member 2123.) In the present embodiment, when the diameter of the cross-section of the first insulation member 2123a is smaller than the diameter of the cross-section of the second insulation member 2123b, it is difficult to sufficiently secure an interval between the first and second bodies 2110a and 2110b for insulation, and when the diameter of the cross-section of the first insulation member 2123a is larger than the diameter of the cross-section of the second insulation member 2123b, an assembly performance of the first body 2110a and the second body 2110b is decreased.

Referring back to FIG. 10A, the first insulation member 2123a may have a width and a height that are larger than those of the second insulation member 2123b. When it is assumed that a width and a height of the first insulation member 2123a are a first width W1 and a second height H1 and a width and a height of the second insulation member 2123b are a second width W2 and a second height H2, the first width W1 may be larger than the second width W2 and the first height H1 may be larger than the second height H2. The second insulation member 2123b may have a size that is smaller than that of the first insulation member 2123a, which also may protect at least one of the sealing members 2121 while effectively spacing the first body 2110a and the second body 2110b apart from each other and insulating them from each other. In an embodiment of the present disclosure, because a size of the first insulation member 2123a that is closer to the plasma channel space 2130 of the reactor is larger than that of the second insulation member 2123b, a spacing distance between the first body 2110a and the second body 2110b that directly contact the interior space 2130 of the reactor becomes larger. Accordingly, a short-circuit or an arc that may occur between the first body 2110a and the second body 2110b may be minimized.

In an embodiment of the present disclosure, the sealing members 2121 and the insulation members 2123 may be disposed in various forms.

Referring to FIG. 10A, the first insulation member 2123a is provided between the reactor interior space 2130 and the sealing member 2121 such that the sealing member 2121 is not exposed to the plasma in the reactor interior space 2130. The second insulation member 2123b maintains the interval between the first body and the second body. In detail, the first insulation member 2123a may be provided between the reactor interior space 2130 and the first sealing member 2121a and the second insulation member 2123b may be provided between the first sealing member 2121a and the second sealing member 2121b, whereby the first insulation member 2123a, the first sealing member, the second insulation member 2123b, and the second sealing member 2121b may be disposed in a sequence thereof. Here, the first insulation member 2123a may be smaller than a diameter of the first sealing member 2121a in the ring, and an inner diameter of the second insulation member 2123b in the ring may be larger than that of the first sealing member 2121a and smaller than that of the second sealing member 2121b.

The sealing members 2121 and the insulation members 2123 may be disposed in various forms unlike in FIG. 10A, and referring to FIG. 10C, the first insulation member 2123a may be provided between the reactor interior space 2130 and the sealing member 2121 such that the sealing members 2121 are not exposed to the plasma of the reactor interior space 2130. The second insulation member 2123b is provided between the first insulation member 2123a and the sealing member 2121 to block a space between the reactor interior space 2130 and the sealing member 2121 once again. In detail, the first insulation member 2123a and the second insulation member 2123b may be sequentially provided between the reactor interior space 2130 and the first sealing member 2121a, and then, the first sealing member 2121a and the second sealing member 2121b may be provided outside the second insulation member 2123b. In this case, the first insulation member 2123a, the second insulation member 2123b, the first sealing member, and the second sealing member 2121b are disposed in a sequence thereof.

In the present disclosure, a corner of a portion the first body 2110a and/or the second body 2110b, which contacts the insulation member 2123, may be chamfered and rounded. When a corner of the first body 2110a and/or the second body 2110b is chamfered, accumulation of charges at the corner portion is prevented and generation of arcs is reduced. When the corner portion is not rounded, it has a sharp shape as compared with other portions, and thus, charges are accumulated whereby discharge of arcs may be induced in a form of a lighting rod. In addition, because the corners of the first body 2110a and the second body 2110b are rounded, the insulator 2120 maximally prevents corresponding portions of the first body 2110a and the second body 2110b from directly facing each other at the rounded portions, and sequentially increases the distance to maximally decrease discharge of arcs. Moreover, particles stacked between the first and/or second bodies 2110b and the insulation member 2123 are decreased through the rounding, and short-circuits and arcs generated between the first and second bodies 2110a and 2110b may be decreased thereafter even when the particles are stacked.

As described above, according to an embodiment of the present disclosure, the plurality of sealing members 2121 are provided, and a space between the interior space 2130 of the reactor and the outside is stably encapsulated with vacuum. In addition, the plurality of insulation members 2123 may be provided, and the sealing members 2121 may be effectively protected while the first body 2110a and the second body 2110b are insulated.

In an embodiment of the present disclosure, the shape of the insulation member 2123 may be variously changed. For example, the shape of the first insulation member 2123a may be asymmetrical with respect to a specific line. For example, a cross-section of the first insulation member 2123a, as illustrated in FIG. 10B, may be asymmetrical with respect to a line that is perpendicular to a ground surface, and a possibility of errors of wrong assembly is lowered during the assembly through the asymmetrical shape. For example, a possibility of reverse assembly in an opposite direction to the first insulation member 2123a is lowered.

In an embodiment of the present disclosure, inner surfaces of the first and second bodies 2110a and 2110b and an inner surface of the reactor interior space 2130 of the insulation member 2123 may have various shapes.

In the above-described embodiment, it is illustrated that the inner surface of the first insulation member 2123a is disposed on the same plane as the inner surfaces of the first body 2110a and the second body 2110b in the interior of the reactor, but the present disclosure is not limited thereto, and the inner surface of the first insulation member 2123a may protrude from the inner surfaces of the first body 2110a and the second body 2110b in the interior of the reactor. Here, In both of cases, in which the inner surface of the first insulation member 2123a is disposed on the same plane as the inner surfaces of the first body 2110a and the second body 2110b in the interior of the reactor and the inner surface of the first insulation member 2123a protrudes from the inner surfaces of the first body 2110a and the second body 2110b in the interior of the reactor, an inner diameter of an inner insulation ring may be implemented to be perpendicular to the ground surface.

FIG. 10D illustrates the insulator 2120 according to an embodiment of the present disclosure, and is a cross-sectional view illustrating that the inner surface of the first insulation member 2123a protrudes from the inner surfaces of the first body 2110a and the second body 2110b in the interior of the reactor. Other points that are different from those of the above-described embodiments will be described in the following embodiments to avoid repetition of the descriptions, and parts that will not be described follow the above-described embodiments.

Referring to FIG. 10D, inner diameters R2a and R2b of the first insulation member 2123a may be values that are smaller than an inner diameter R11 of the first body 2110a. Here, a portion of the first insulation member 2123a has a protrusion PR that protrudes from the inner surface of the first body 2110a toward the reactor interior space (that is, the inner side).

Because a gap between the first body 2110a and the second body 2110b is widened by the insulation member 2123, particles are prevented from being loaded at a portion, at which the insulation member 2123 is installed. Therefore, short-circuits or arcs may be prevented from being generated between the first body 2110a and the second body 2110b by the particles loaded in the insulator 2120.

According to an embodiment of the present disclosure, the first insulation member 2123a may have an slanted surface SL of the inner surface of the protrusion PR exposed to an inside of the reactor. In other words, the drawing is a view illustrating that the inner surface of the first insulation member 2123a protrudes from the inner surface of the first body 2110a and/or the second body 2110b in the interior of the reactor, and is inclined with respect to the inner surface of at least one of the first and second bodies 2110a and 2110b. Furthermore, the first insulation member 2123a may have a flat surface FS that is parallel to the inner surface of at least one of the first and second bodies 2110a and 2110b.

The slanted surface SL corresponds to a slanted surface in a shape, an inner diameter of which becomes smaller as it goes downwards. In more detail, the first insulation member 2123a has a shape that protrudes from the inner surface of the first body 2110a, and has an inner diameter that is smaller than the inner diameter R11 of the first body 2110a. Then, the inner diameter R2a of an upper side and the inner diameter R2b of a lower side of the first insulation member 2123a may have different values, and the inner diameter R2a of the upper side may have a value that is smaller than the inner diameter R2b of the lower side.

In this way, when the first insulation member 2123a has a shape that protrudes from the inner surface of at least one of the first and second bodies 2110a and 2110b and the inner surfaces of the first and second bodies 2110a and 2110b have inclined shapes, a possibility of particles being stacked on the slanted surface SL is reduced even when the particles are generated in the interior of the reactor. Accordingly, short-circuits or arcs that may occur between the first and second bodies 2110a and 2110b are remarkably reduced.

Here, the second insulation member 2123b outside the first insulation member 2123a may not have a shape, such as a slanted surface, because it is not directly exposed to the plasma channel space 2130 and a possibility of the particles being stacked also is very low. Accordingly, a side surface of the second insulation member 2123b may be not a slanted surface but a flat surface.

In embodiments of the present disclosure, the shapes of the first and second bodies 2110a and 2110b and the insulator 2120 may be variously changed, and the inner diameters of the inner surfaces of the first and second bodies 2110a and 2110b and the shape of the protrusion PR of the insulation member 2123 may be variously changed.

According to an embodiment of the present disclosure, the shape of the insulation member and accordingly the locations of the first and second sealing members may be variously modified.

Referring to FIG. 10E, the insulation member 2123a may have a boss that protrudes in an opposite direction to a direction that faces the plasma channel space, and the first and second sealing members 2121a and 2121b may be provided between the first and second bodies 2110a and 2110b, and the insulation member 2123a. For example, the first sealing member 2121a may be provided between the first body 2110a and the insulation member 2123a, and the second sealing member 2121b may be provided between the second body 2110b and the insulation member 2123a.

The reactor system having the above-described structure, and the plasma generating device including the reactor system have a structure, in which the plasma forming channel is expanded to the interior of the collector and the reactor body itself is directly connected to the collector. Accordingly, because the plasma forming channel is repeatedly formed in the collector, a reactivity of the exhaust gas due to the plasma is enhanced and the by-product are not stacked in the reactor body but are stacked directly in the collector. Accordingly, according to an embodiment of the present disclosure, a possibility of, the process by-product that are not deposited on a surface of a semiconductor substrate in the process chamber, being deposited in an exhaust pipe, an interior of the vacuum pump, and other exhaust paths thereafter is significantly decreased. Accordingly, an exhaustion efficiency of the vacuum pump and a vacuuming efficiency of the process chamber may be improved, and a frequency of breakdowns of the vacuum pump itself may be decreased, whereby a life span of the vacuum pump is further prolonged. As a result, a production capability of process equipment and a yield rate of the process are increased.

In an embodiment of the present disclosure, in addition to the gas injection hole, through which the gases are injected, an additional gas injection hole provided between the injection hole and the collector may be further installed.

Figure 11:
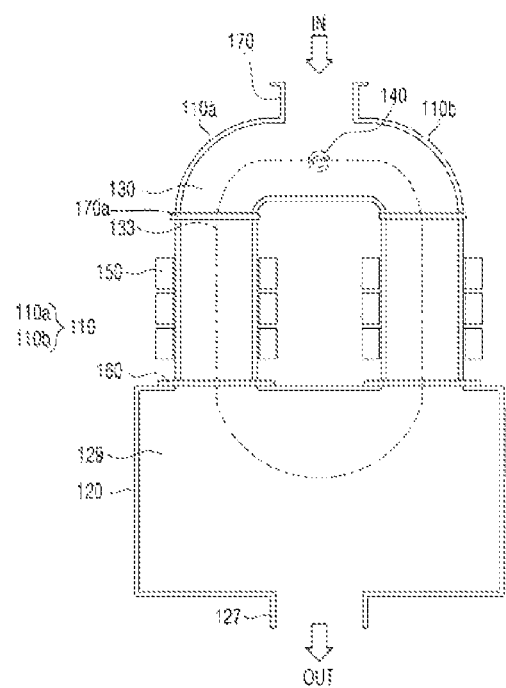
FIG. 11 is a cross-sectional view illustrating a plasma generating device, on which an additional gas injection hole is additionally mounted.

FIG. 11 is a cross-sectional view illustrating the plasma generating device, on which the additional gas injection hole is additionally mounted.

Referring to FIG. 11, an additional gas injection hole 170a may be formed between the gas injection hole 170 and the collector 120, for example, on an upper side of the branches that are close to the gas injection hole 170. The additional gas injection hole 170a has one or more gas supply holes for providing the gases to the reaction space 130. The gases may be additionally provided to the reaction space 130 through the additional gas injection hole 170a, and thus the gases may be distributed in the reaction space 130 on an upper layer of the reaction space 130, and in particular, the gases may be distributed into the reaction space 130 while avoiding a portion, at which the by-product are stacked around the gas injection hole 170. In the present embodiment, the plasma may be mainly formed on a lower side of an area, in which the additional gas injection hole 170a is formed.

The gases provided through the additional gas injection hole 170a may be various, and for example, the gas may be oxygen. When TiN is treated by supplying oxygen, titanium oxide powder is restrained from being stacked at a site, at which the branch part of the reactor body 110 is branched, and is stacked in a collection area of the lower collector 120. Accordingly, contamination of the reactor body 110 is decreased, whereby a use time thereof may be remarkably increased.

In an embodiment of the present disclosure, the shapes of the first branch 110a and the second branch 110b of the reactor body 110, that is, the shape of a shoulder part may be variously modified. For example, on the cross-section, the outer shapes of the first branch 110a and the second branch 110b may have a shape of a portion of a rectangle, other than an elliptical or circular shape.

In an embodiment of the present disclosure, the additional gas injection hole 170a may be formed together with the insulator in the above-described embodiment. For example, the additional gas injection hole 170a may be integrally formed with some of the components of the insulator or may be coupled thereto through assembly even though they are not integrally formed.

Figure 12:
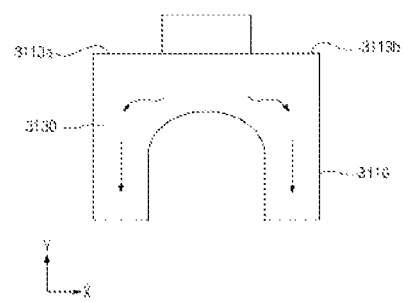
FIG. 12 illustrates a portion of the plasma generating device, and illustrates a cross-section of a shoulder part according to an embodiment of the present disclosure.
Figure 13A:
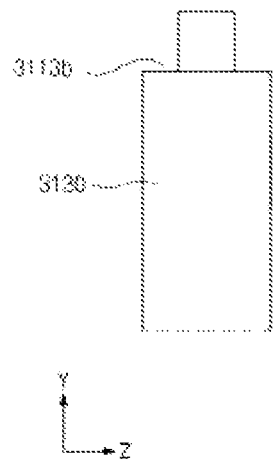
FIGS. 13A and 13B illustrate a portion of the plasma generating device, and illustrate a cross-section of a shoulder part according to an embodiment of the present disclosure, when viewed from a lateral side.
Figure 13B:
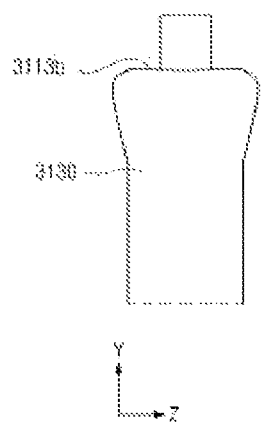

FIG. 12 illustrates a portion of the plasma generating device, and illustrates a cross-section of the shoulder part according to an embodiment of the present disclosure. FIGS. 13A and 13B illustrate a portion of the plasma generating device, and illustrate a cross-section of the shoulder part according to an embodiment of the present disclosure, when viewed from a lateral side.

Referring to FIGS. 12, 13A, and 13B, a reactor body 3110 has first and second branch parts 3113a and 3113b, in which a plasma channel space 3130 are provided in interiors thereof.

In an embodiment of the present disclosure, the first branch part and the second branch part may have a rectangular shape other than a streamlined curve that is continuous downwards. Furthermore, inner surfaces of the first and second shoulder parts include downward curves, and the shapes substantially coincides with the shape of the plasma channel. In an embodiment of the present disclosure, to minimize foreign substances that may be accumulated in the shoulder part 3113b, the shape of the shoulder part 3113b may be versified such that the reactor shoulder part 3113b is provided at a location that deviates from the passage. In an embodiment of the present disclosure, foreign substances is prevented from being stacked by spacing the inner surface of the shoulder part 3113b to a distance that is farther from the plasma channel than other portions (for example, a parallel portion) at a site, at which the foreign substances of the shoulder part 3113b are severely stacked.

For example, the shoulder part 3113b may have at least one of a rectangular shape, a dome shape, or a slanted shape, other than a streamlined curve that is continuous downwards. Here, it is apparent that the shape of the shoulder part 3113b may be differently set according to the shape of the plasma channel. In an embodiment of the present disclosure, corners of the inner surface of the shoulder part 3113b may contact each other to have a specific angle or may be rounded. Furthermore, portions of the corners of the inner surface of the shoulder part 3113b may have curves surfaces.

In an embodiment of the present disclosure, the shape of the shoulder part 3113b when viewed from a lateral side also may be at least one of a rectangular shape, a dome shape, and a slanted shape other than a streamlined curve that is continuous downwards. Furthermore, a width of the shoulder part also may have different values according to a location thereof.

Referring to FIG. 13A, the shoulder part 3113b may have a rectangular cross-section even when viewed from a lateral side. Referring to FIG. 13B, the shoulder part 3113b may have a shape other than a rectangular shape, and may have different diameters according to an extension direction of the shoulder part 3113b.

In an embodiment of the present disclosure, a cooling part may be installed in the reactor body.

Figure 14:
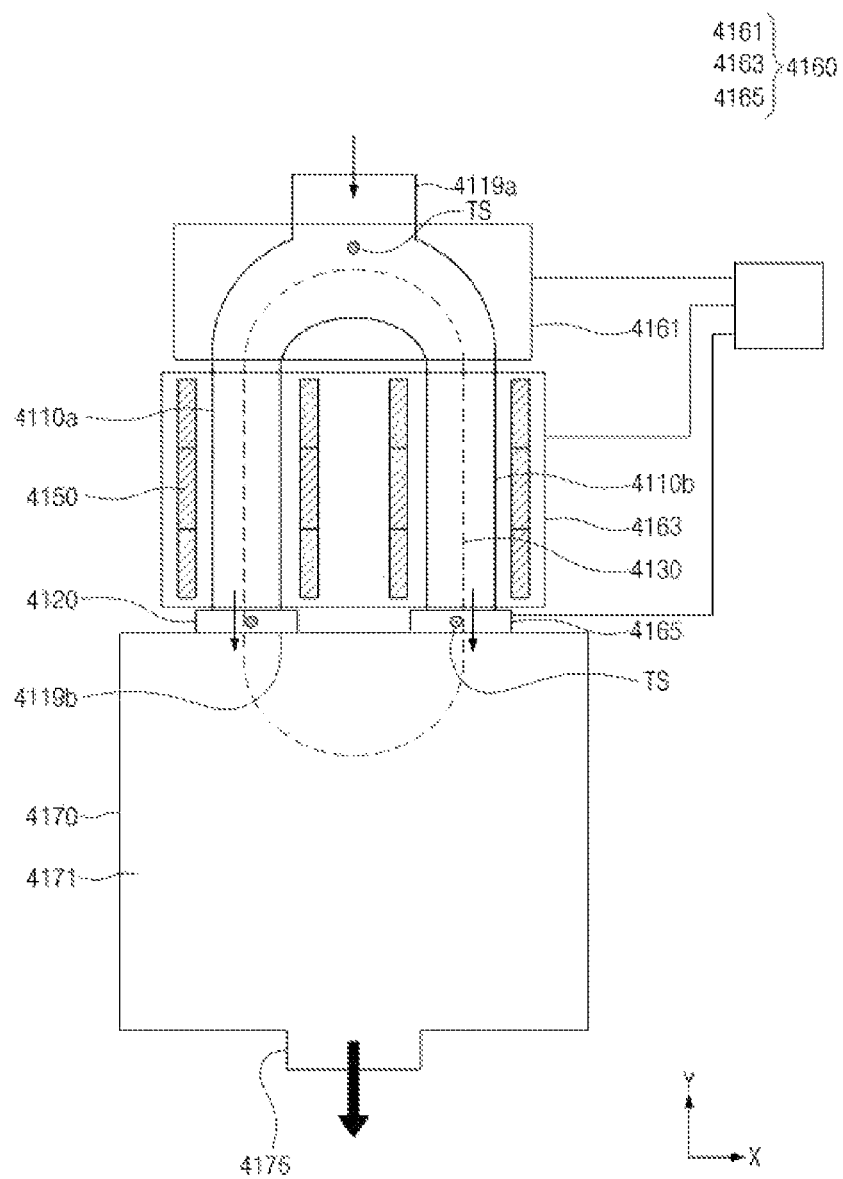
FIG. 14 is a cross-sectional view illustrating a plasma generating device according to an embodiment of the present disclosure.
Figure 15A:
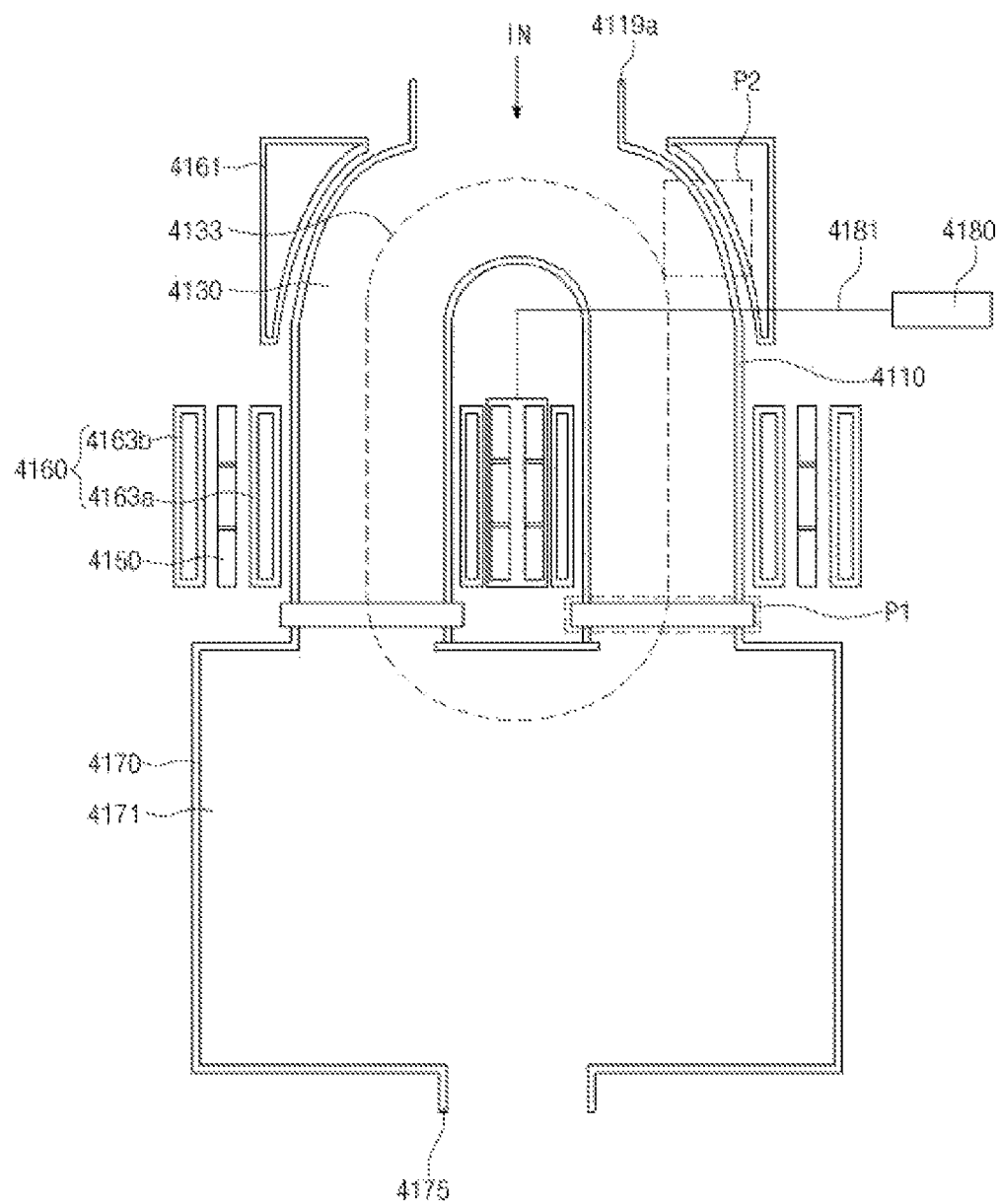
FIGS. 15A and 15B are cross-sectional views illustrating the plasma generating device of FIG. 14 in more detail.
Figure 15B:
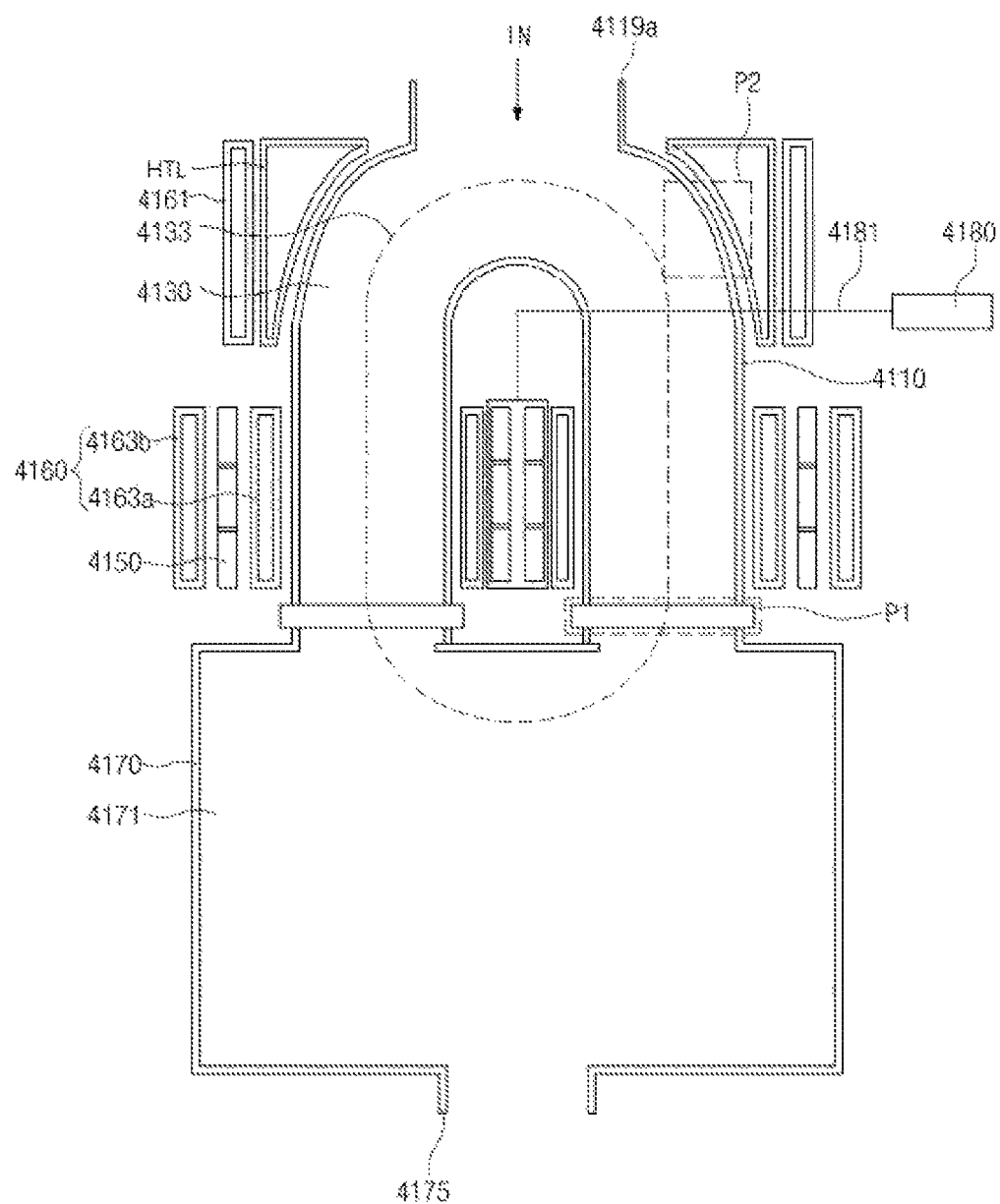
Figure 16:
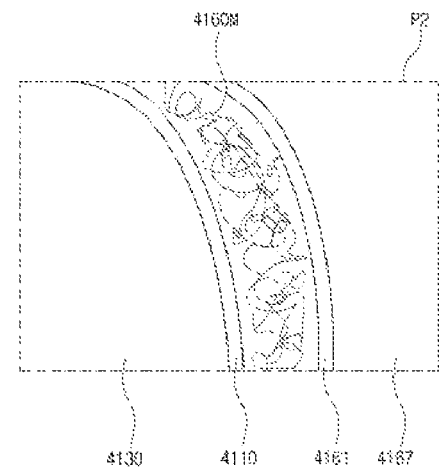
FIG. 16 illustrates a portion of a reactor according to an embodiment of the present disclosure, and is a cross-sectional view corresponding to portion P2 of FIG. 14.

FIG. 14 is a cross-sectional view illustrating the plasma generating device according to an embodiment of the present disclosure. FIGS. 15A and 15B are cross-sectional views illustrating the plasma generating device of FIG. 14 in more detail. FIG. 16 illustrates a portion of a reactor according to an embodiment of the present disclosure, and is a cross-sectional view corresponding to portion P2 of FIG. 14.

FIG. 14 is a cross-sectional view illustrating the plasma generating device provided with the cooling part.

Referring to FIG. 14, a cooling part 4160 includes at least one of a main cooling part 4161 that is provided in correspondence to a reactor body 4110, except for a part of the reactor, in which a magnetic core is provided, a core cooling part 4163 that is provided to be adjacent to the magnetic core to control a temperature of the magnetic core, and an insulator cooling part 4165 that is provided in an insulator 4120 to control a temperature of the insulator 4120.

The core cooling part 4163 may include an inner core cooling part 4163a that is provided between the reactor body 4110 and the magnetic core, and an outer core cooling part 4163b that is spaced apart from the reactor body 4110 while the magnetic core being interposed therebetween and is provided on an outer side of the reactor body 4110. Both of the inner core cooling part 4163a and the outer core cooling part 4163b may be provided, but the present disclosure is not limited thereto, and one of them may be provided. The insulator cooling part 4165 may be provided in the insulator 4120.

However, the classification of the cooling part 4160 is for convenience of description, and some of the configurations of the cooling parts 4160 may be connected to each other to be integrally formed. For example, the main cooling part 4161 may be connected to the inner core cooling part 4163a to define one passage. Furthermore, the main cooling part 4161 may be connected to both of the inner core cooling part 4163a and the insulator cooling part 4165 to define one passage.

The cooling part 4160, that is, the main cooling part 4161, the core cooling part 4163, and/or the insulator cooling part 4165 may be provided with a cooling fluid pipeline 4167, through which a cooling fluid flows in the interior thereof. The cooling fluid pipeline 4167 may be provided with various materials for cooling, for example, water, oil, or air. The cooling fluid may be provided at various temperatures that are lower than a temperature of the reactor or a temperature of the magnetic core.

The cooling part 4160 is provided with a cooling fluid inlet and a cooling fluid outlet, through which the cooling fluid is introduced and discharged. When the plurality of cooling parts 4160 are provided, at least two of the plurality of cooling parts 4160 may be connected to each other through a pipeline such that the cooling fluid flows through the pipeline.

A valve may be installed in the pipeline provided in the cooling part 4160, and a flow rate of the cooling fluid that flows in the cooling part 4160 may be adjusted by adjusting an opening degree of the valve. The flow rate of the cooling fluid may vary according to a descending speed of a temperature and a target temperature that is to be lowered finally. Accordingly, the cooling fluid may be controlled to be maintained within a temperature range desired by the reactor for a proper time period by controlling the flow rate of the cooling fluid.

In FIG. 15A, reference numerals 4119a, 4130, 4150, 4170, 4171, and 4175, which have not been described, correspond to the injection hole, the plasma forming space, the transformer, the collector, the collection space, and the collector outlet.

In an embodiment of the present disclosure, a heating part that is provided between the reactor body and the cooling part to provide heat that raises a temperature of the reactor body may be included.

FIG. 15B illustrates a plasma treating apparatus having the heating part. Referring to FIG. 15B, a heating part HTL provides heat that is provided to be adjacent to the reactor to raise a temperature of the reactor. The heating part HTL may be provided or omitted if necessary. The kinds of the heating part HTL are not limited as long as heat may be provided to the reactor, and for example, the heating part HTL may be provided in a form of a heating wiring line that may control whether heat is to be emitted according to switching on/off of a power source.

The heating part HTL is switched on to provide heat to the reactor when a temperature of the reactor is excessively low in a condition, in which the temperature of the reactor has to be a specific temperature or more, and thus it functions to maintain the temperature of the reactor within a desired temperature range. Furthermore, when a rapid change in the temperature of the reactor is expected, a rapid change in the temperature of the reactor may be prevented by switching on and off the heating part HTL.

In this way, when the heating part that is provided between the reactor body and the cooling part to provide heat that raises the temperature of the reactor is further included, the cooling part may maintain a temperature of the heating part, which is excessively raised, within a desired temperature range.

Referring to FIG. 16, the cooling part 4160 may be spaced apart from the reactor body 4110 by a specific distance. A space between the reactor body 4110 and the cooling part 4160, which are spaced apart from each other, may be in a state, in which nothing is provided, that is, a state, in which it is filled with air, but an absorption member 4160M that absorbs heat transfer between the reactor body 4110 and the cooling part 4160 may be provided. This is because a rapid change in the temperature of the reactor body may be restrained by bringing the reactor body 4110 and the cooling part 4160 into direct contact with each other and an entire process time may be shortened by promptly changing a plasma-off state into a plasma-on state. That is, the reactor body 4110 may be promptly prepared in a specific temperature state for executing a process when the plasma-off state (a process stand-by state) is transited to the plasma-on state (a process preparation state). In an embodiment of the present disclosure, the absorption member 4160M may be a conductor having a specific thermal conductivity. However, a material of the absorption member 4160M may be determined in consideration of thermal conductivities according to plasma-on/off times of the treatment process. For example, the absorption member 4160M may be formed of a metal, and may be formed of a non-woven metal. Furthermore, the absorption member 4160M may be formed of a porous material. When the absorption member is formed of the non-woven metal, a degree of heat transfer may vary according to contact areas between the absorption member 4160M and the reactor body 4110 and between the absorption member 4160M and the cooling part 4160.

According to an embodiment of the present disclosure, a temperature sensor that senses a temperature of the reactor body, at least one cooling part provided in the reactor body, and a controller that controls an on/off state of at least one of the reactor body and the cooling part based on the temperature sensed by the temperature sensor.

A controller 4190 controls at least one of the reactor and the cooling part 4160 based on the temperature sensed by a temperature sensor TS. That is, the controller 4190 may switch on or off at least one of the reactor (for example, the reactor body 4110 and/or a transformer 4150) and the cooling part 4160 when the temperature detected by the temperature sensor TS is within a specific section according to operations of the process.

For example, the controller may perform the following four modes of the plasma generating device in relation to a progress of the process. 1) Process starting mode, 2) Process executing mode, 3) Process rest mode, and 4) Process ending mode.

In an embodiment of the present disclosure, at least one of the reactor and the cooling part may be switched on or off such that the temperature of the reactor is within the specific section in at least one of the modes when the plasma generating device is driven in one of the process starting mode, the process executing mode, the process rest mode, and the process ending mode.

Figure 17:
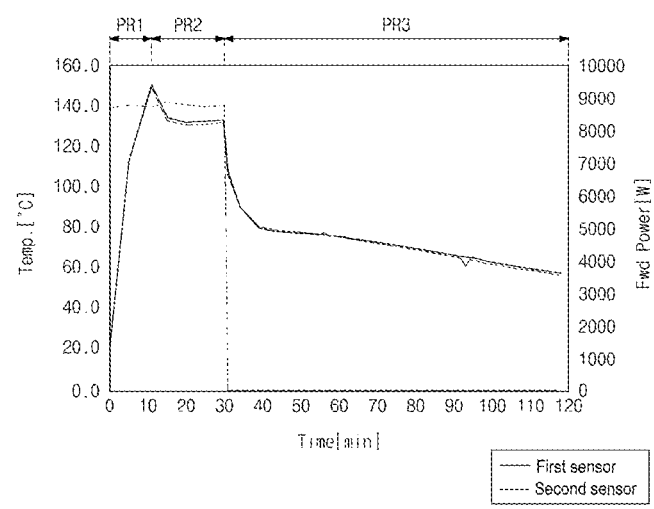
FIG. 17 is a graph depicting a temperature of a reactor when a process starting mode, a process executing mode, and a process ending mode are performed by a method of driving the reactor and the cooling part, which have been described above.

FIG. 17 is a graph depicting a temperature of the reactor when the process starting mode, the process executing mode, and the process ending mode are performed by a method of driving the reactor and the cooling part, which have been described above. In FIG. 17, the temperature of the reactor was measured while the temperature sensors installed in the first and second branch parts are taken as first and second sensors, and sections corresponding to the process starting mode, the process executing mode, and the process ending mode are denoted by PR1, PR2, and PR3.

Referring to FIG. 17, because the reactor is switched on in a state, in which the cooling part is switched off in the process starting mode, temperature may be raised for a very short time. Accordingly, a temperature, at which the plasma process may be stably progressed, may be reached in a short time. In particular, it may be identified in FIG. 17 that the temperature of the reactor was raised to about 140 degrees in about 9 minutes.

After a specific temperature (for example, 150 degrees) is reached in the process starting mode, the process executing mode is started while the cooling part is switched on in a state, in which the reactor is on. Accordingly, in the process executing mode, a temperature of 150 degrees or less, for example, a temperature of about 130 degrees may be stably maintained as the cooling part is driven.

When the process is ended after the progress of the process is ended, the process ending mode is started while the reactor is switched off. Then, it may be identified that temperature of the reactor is not rapidly lowered but is slowly lowered around about 80 degrees as the cooling part is switched off together when the reactor is switched off (see section PR3). Accordingly, damage due to a rapid change of the temperature of the reactor may be prevented. According to an embodiment of the present disclosure, the reaction space that overlaps the collection area in the collector may have various volumes, and a movable member for adjusting this may be provided.

Figure 18:
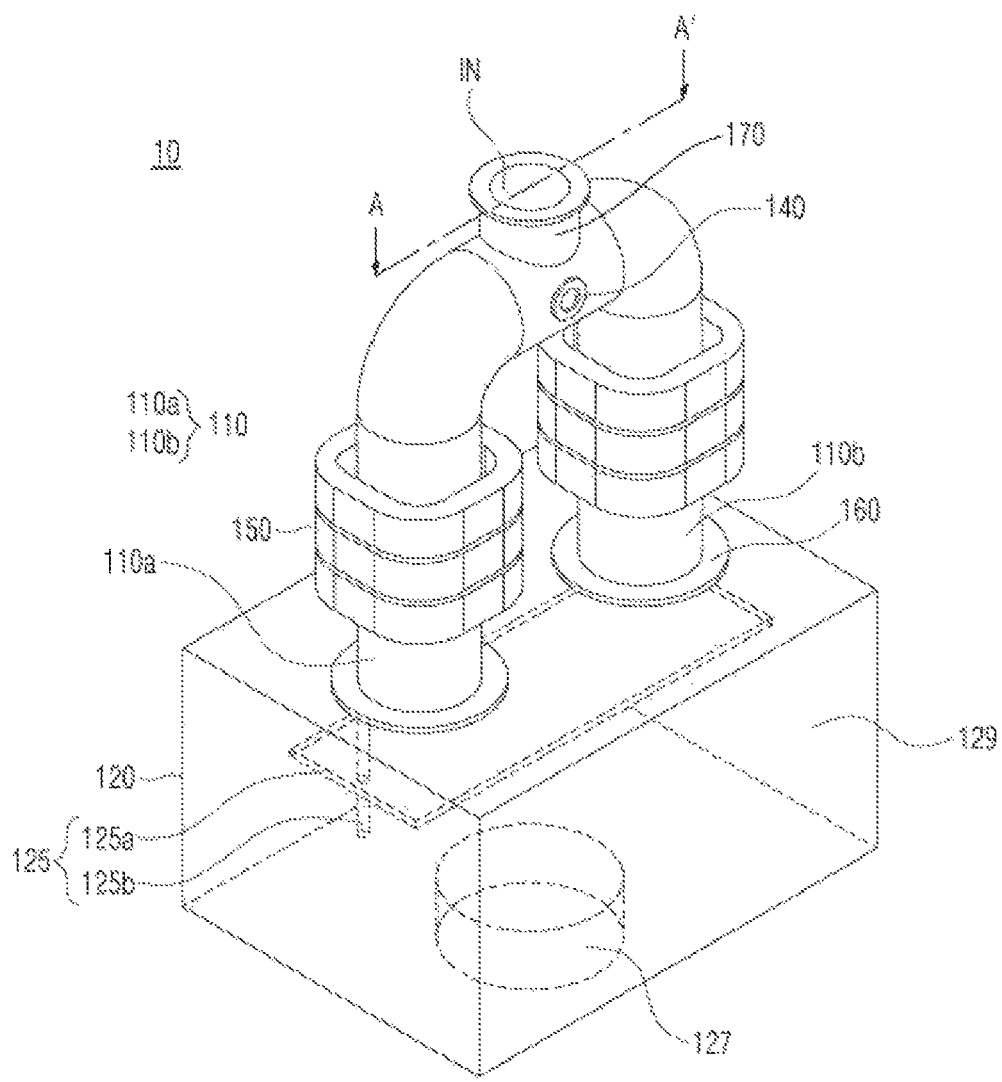
FIG. 18 is a perspective view illustrating a plasma generating device provided with a movable member.
Figure 19A:
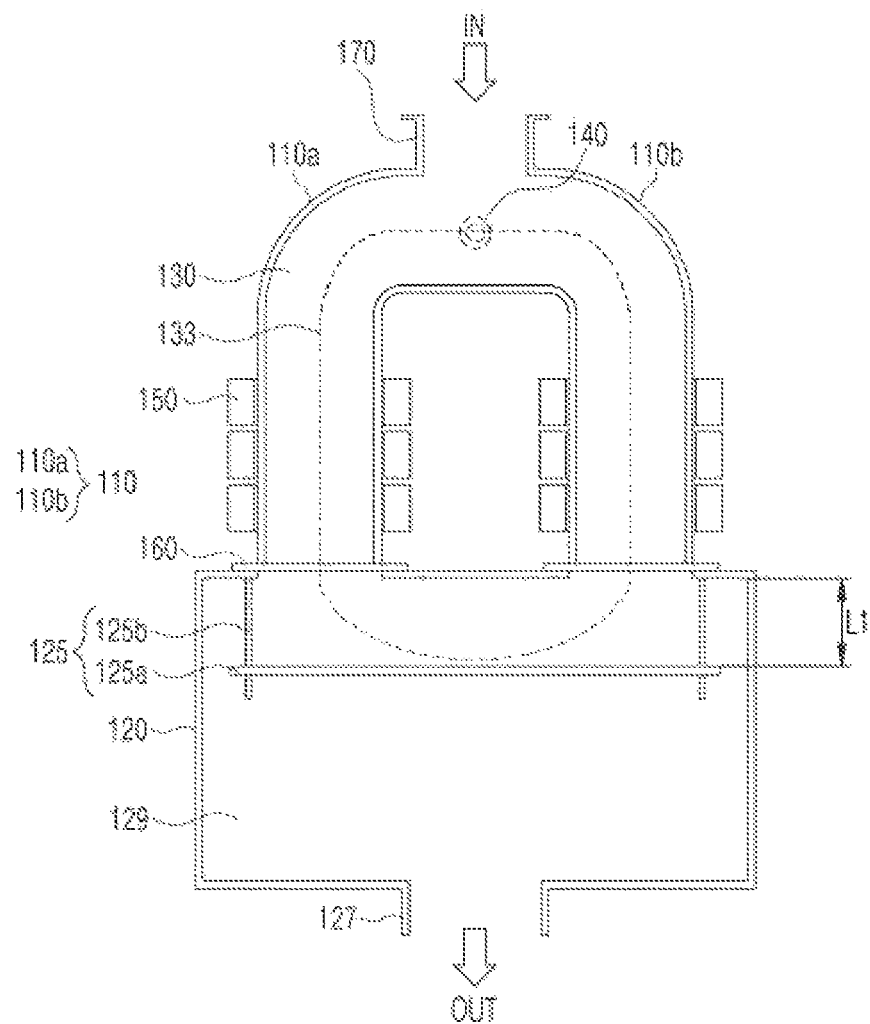
FIGS. 19A and 19B are cross-sectional views of the plasma generating device of FIG. 18.
Figure 19B:
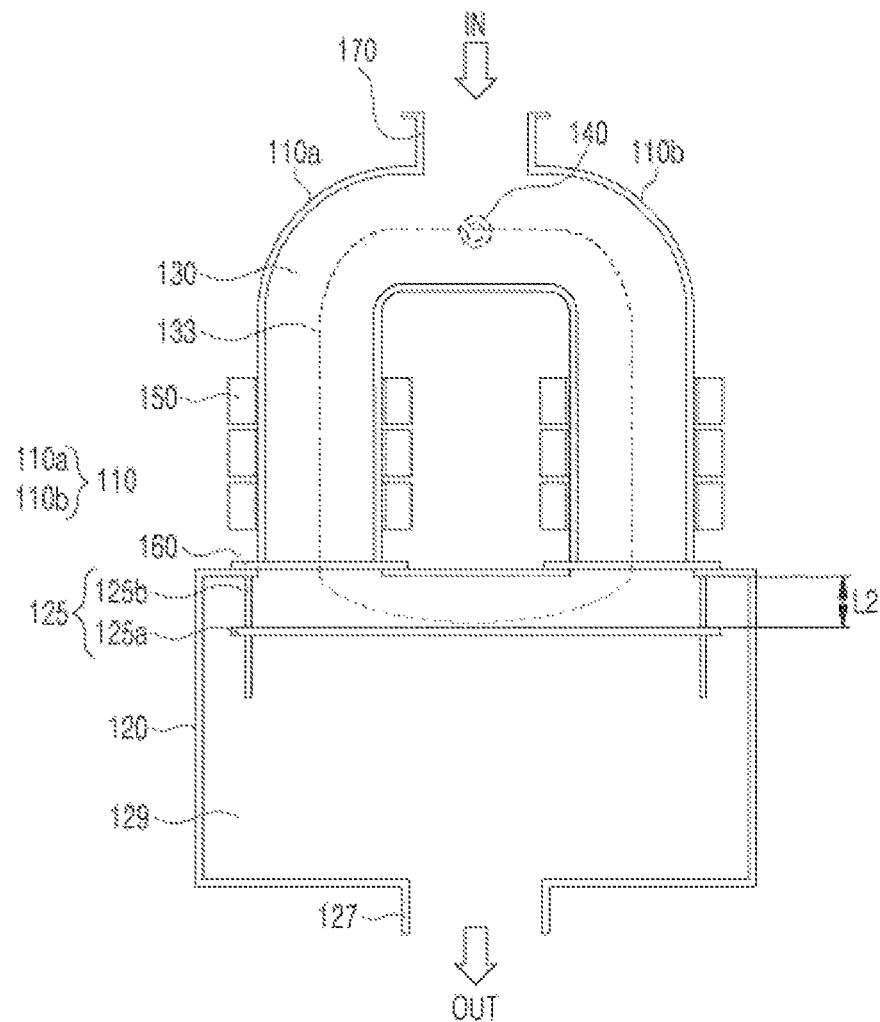
Figure 20A:
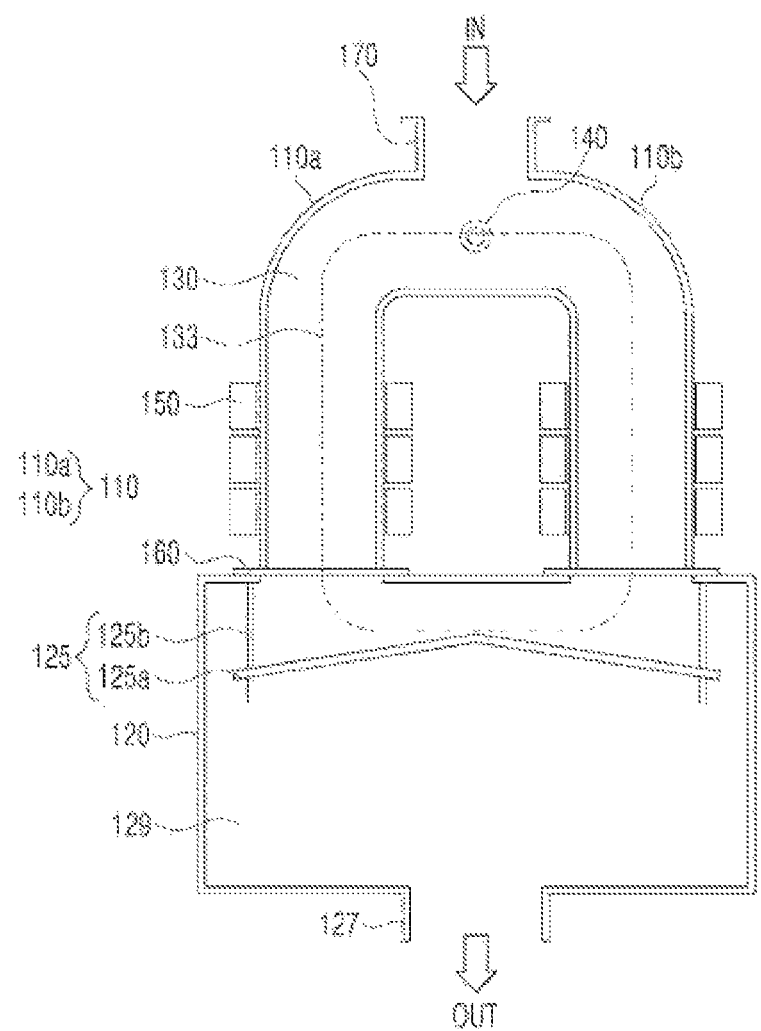
FIGS. 20A to 20D are cross-sectional views illustrating a plasma generating device, on which movable members having various shapes are mounted.
Figure 20B:
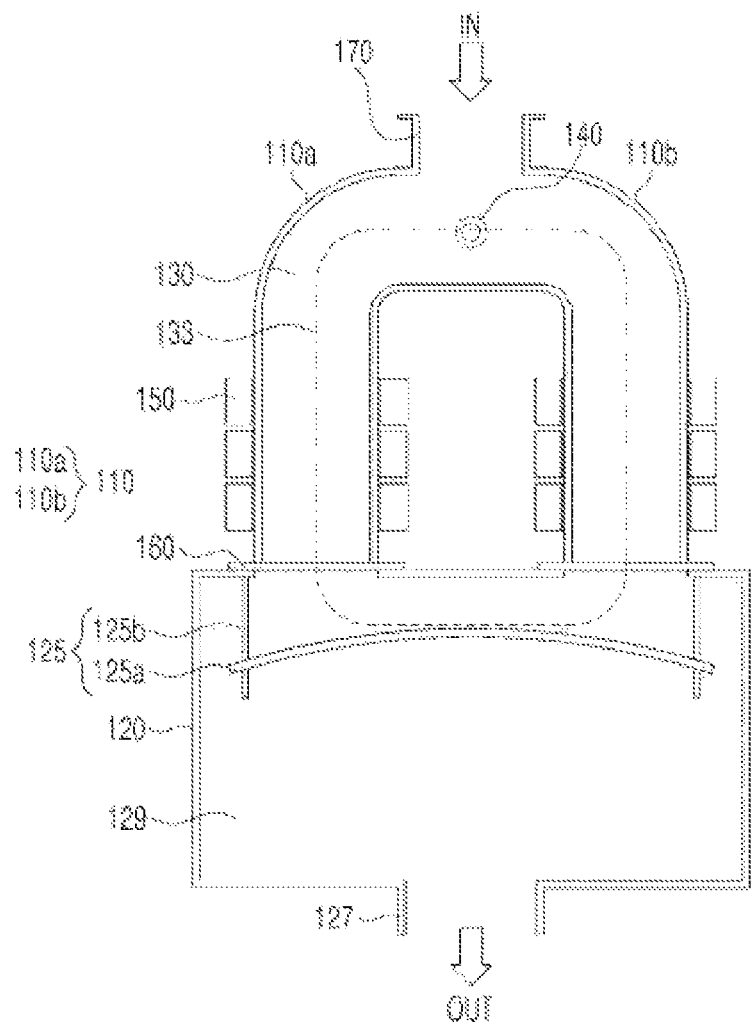
Figure 20C:
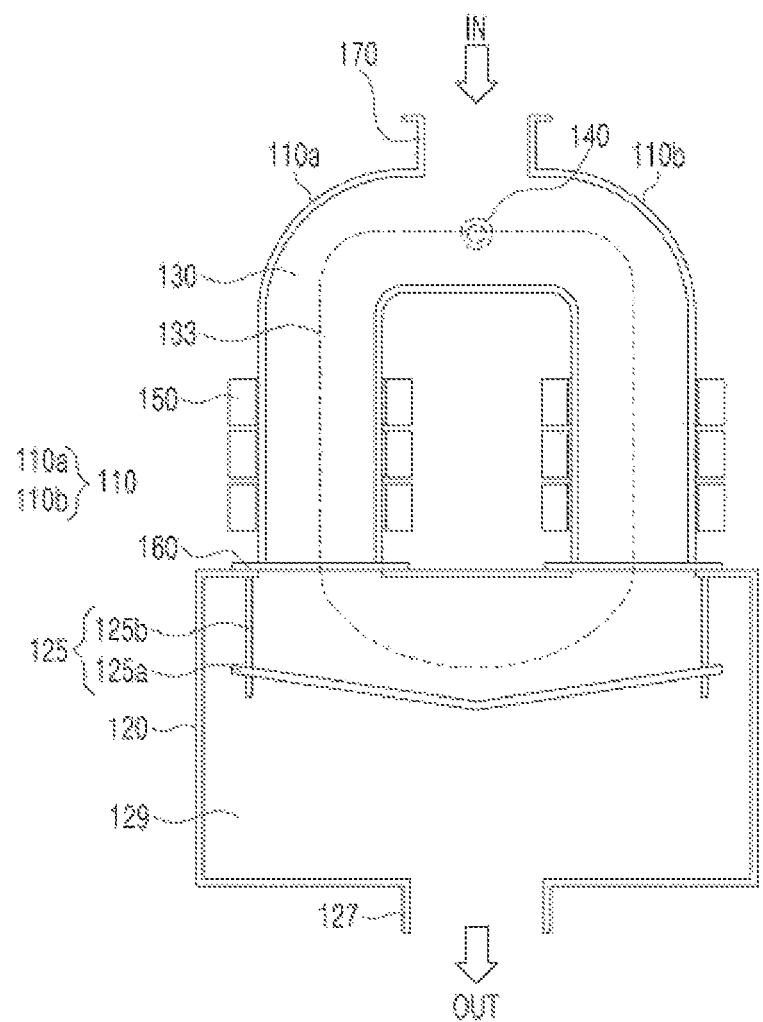
Figure 20D:
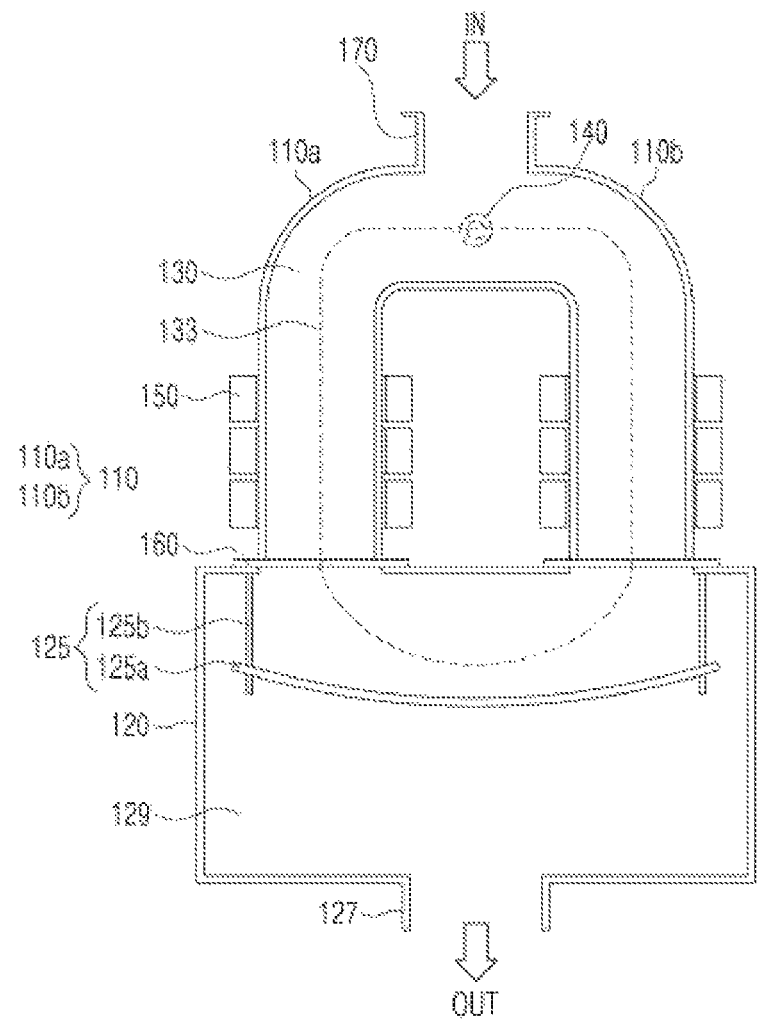

FIG. 18 is a perspective view illustrating the plasma generating device provided with the movable member, and FIGS. 19A and 19B are cross-sections of the plasma generating device of FIG. 5.

Referring to FIGS. 18, 19A, and 19B, a movable member 125 that restrains a reaction area may be provided in an area that is adjacent to the reactor body 110 in the collector 120.

The movable member 125 may be provided in the collection space 129, and may be moved in at least one of upward, downward, leftward, and rightward directions, or through rotation at a specific angle.

The movable member 125 may include a plate 125a that restrains the reaction area, and a support member 125b that supports the plate 125a. The support member 125b supports the plate 125a such that the plate 125a is disposed at a proper location of the collector 120. A motor and the like may be additionally mounted on the support member 125b to variously move the location of the plate 125a on the support member 125b. Through this, the movable member 125 becomes closer to or farther from the reactor body 110 to control a size of a channel area of the reaction space 130.

For example, in an embodiment of the present disclosure, the movable member 125 may be mounted at a first distance L1 from an uppermost part of the collector 120 connected to the reactor body 110, and may be moved according to a setting to be moved to a second distance L2 that is smaller than the first distance L1. Furthermore, it may be moved in a reverse direction, and may be moved to a distance having any value between the first distance L1 and the second distance L2.

An internal conductance in the reaction space 130 may be adjusted through the movement of the movable member 125. Here, the conductance means a difference between pressures of two points when a specific amount of a fluid such as a gas passes through a vacuum pipeline, and it corresponds to a difference between pressures of two arbitrary points when a specific amount of gas passes through the reaction spaces in the reactor body 110 and in the collector 120. According to the conductance, behaviors, flow velocities, and the like of the gas molecules at two arbitrary points are changed, and thus, a plasma reaction degree also is changed.

In an embodiment of the present disclosure, the movable member 125 is moved upwards and downwards, and/or leftwards and rightwards to control a size of the space, in which the plasma channel is formed, and to adjust the conductance according to a change in the size of the space. The degree of a plasma reaction also may be changed through adjustment of the conductance, and formation of the plasma channel and the plasma reaction may be optimized by moving the movable member 125 upwards, downwards, leftwards, and rightwards according to a kind, a reaction time, and the like of the gas or the reactant that causes the plasma reaction.

It has been described in an embodiment of the present disclosure that the movable member that may be moved in at least one of the upward, downward, leftward, and rightward directions as a device for restricting the reaction area in the collector 120, but the present disclosure is not limited thereto. In another embodiment of the present disclosure, it is apparent that a fixed reaction area restricting apparatus that is provided to restrict the reaction area in the collector and cannot be moved may be provided.

In an embodiment of the present disclosure, the movable member may have various shapes.

FIGS. 20A to 20D are cross-sectional views illustrating the plasma generating device, on which movable members having various shapes are mounted.

Referring to FIGS. 20A to 20D, the movable member 125 may have a shape that is concave or convex with respect to the reactor body 110, for example, a plate shape that is concave or convex with respect to the reactor body 110. For example, the movable member 125 may have a shape of inverse "V", inverse "U", "V", and "U". However, the shape of the movable member 125 is exemplary, and it is apparent that it may have various other shapes.

In an embodiment of the present disclosure, the reaction space that overlaps the collection area in the collector may have various shapes, and an area restricting member that restricts the reaction space between the collector and the reactor body or in the collector connected to the reactor body may be provided.

Figure 21A:
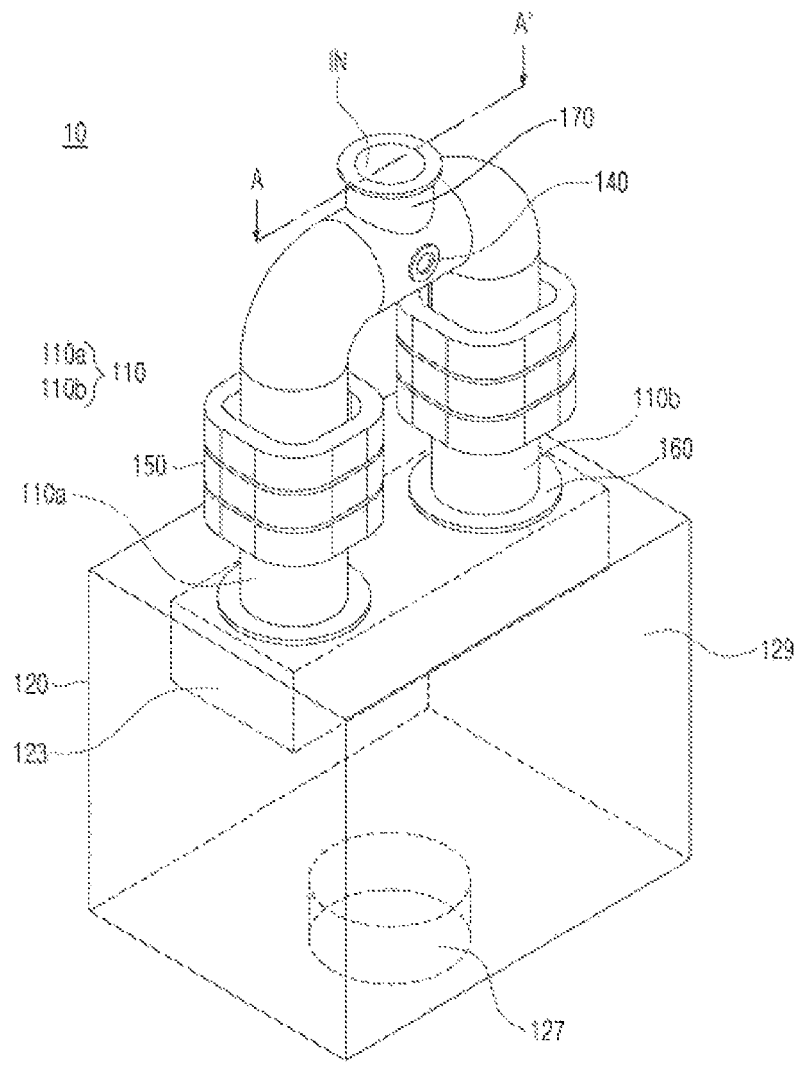
FIGS. 21A to 21C are views illustrating a plasma generating device, on which an area restricting member is mounted, according to an embodiment of the present disclosure.
Figure 21B:
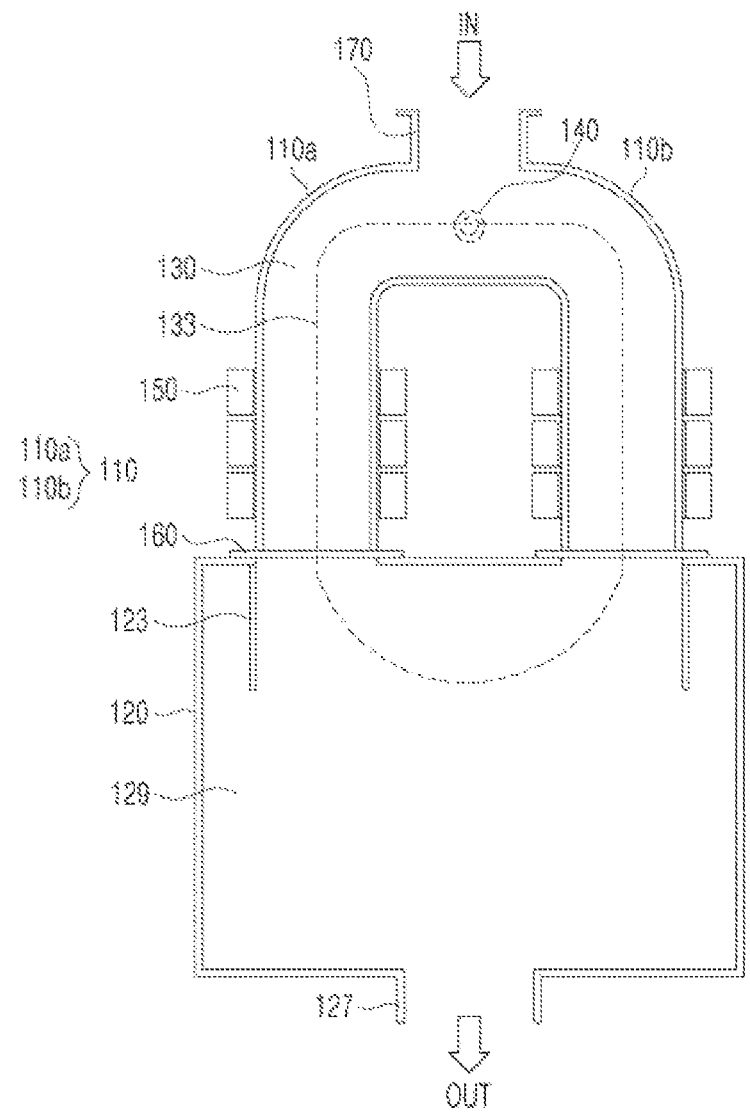
Figure 21C:
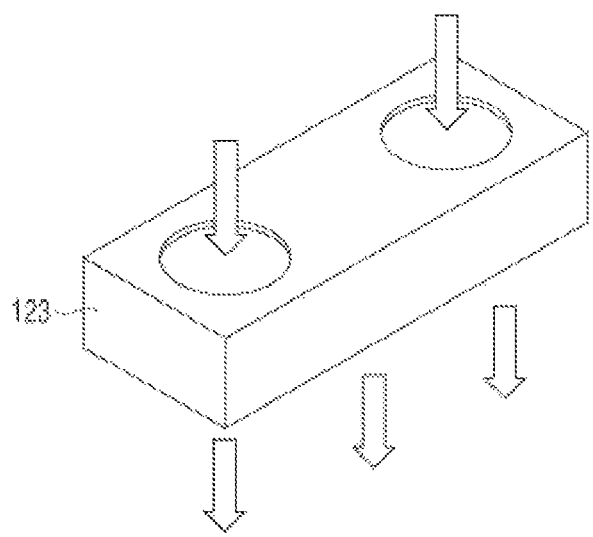

FIGS. 21A to 21C are views illustrating the plasma generating device, on which the area restricting member is mounted, according to an embodiment of the present disclosure, and FIG. 21A is a perspective view, FIG. 21B is a cross-sectional view of FIG. 21A, and FIG. 21C is a perspective view illustrating the area restricting member of FIG. 21A.

Referring to FIGS. 21A to 21C, the reactor body 110 may be connected to the collector 120 directly through an area restricting member 123 without any lower block having a toroidal shape. The area restricting member 123 may be provided between the reactor body 110 and the collector 120 to function as a connection passage.

The area restricting member 123 has openings such that the openings are communicated with the first and second branches 110a and 110b of the reactor body 110 on an upper side thereof, and has an opening such that the opening is communicated with the collection area in the collector on a lower side thereof. Accordingly, the area restricting member 123 may not only restrict the reaction space 130 but also provide a path, in which the plasma reaction gas and the by-product due to the plasma reaction flow. For example, when by-product such as powder are generated in the reaction area, they flow to the collector 120 on the lower side via the area restricting member 123. The plasma reaction gas may flow downwards from the branches of the reactor body 110, and may return to the upper opening of the area restricting member 123 and exit to the lower opening of the area restricting member 123.

In an embodiment of the present disclosure, the area member may have various shapes.

Although FIGS. 21A to 21C illustrate that the area restricting member is provided in a direct pipe shape that extends in the same direction of the extension directions of the branches, the present disclosure is not limited thereto.

Figure 22A:
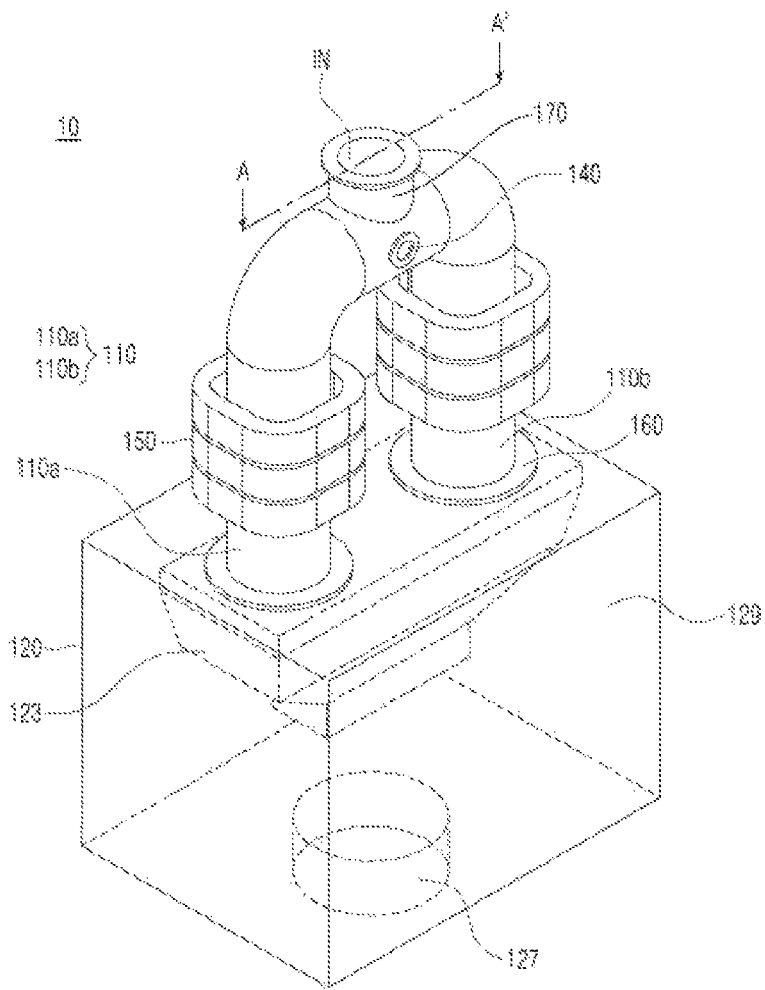
FIGS. 22A to 22C are views illustrating a plasma generating device, on which an area restricting member is mounted, according to an embodiment of the present disclosure.
Figure 22B:
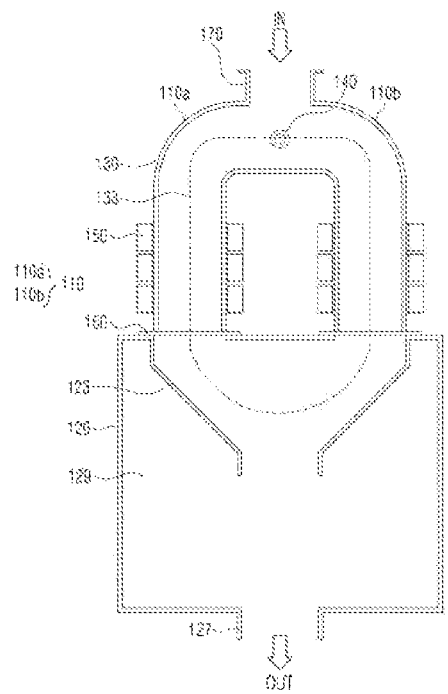
Figure 22C:
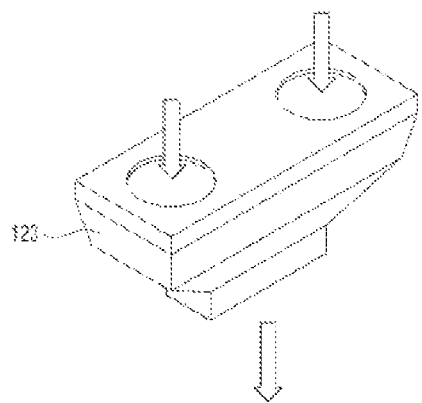

FIGS. 22A to 22C are views illustrating the plasma generating device, on which the area restricting member is mounted, according to an embodiment of the present disclosure, and FIG. 22A is a perspective view, FIG. 22B is a cross-sectional view of FIG. 22A, and FIG. 22C is a perspective view illustrating the area restricting member of FIG. 22A. Referring to FIGS. 22A to 22C, the area restricting member 123 may have an inverse ladder shape or a funnel shape, an inner diameter of which decreases as it becomes farther from the reactor body 110.

Figure 23A:
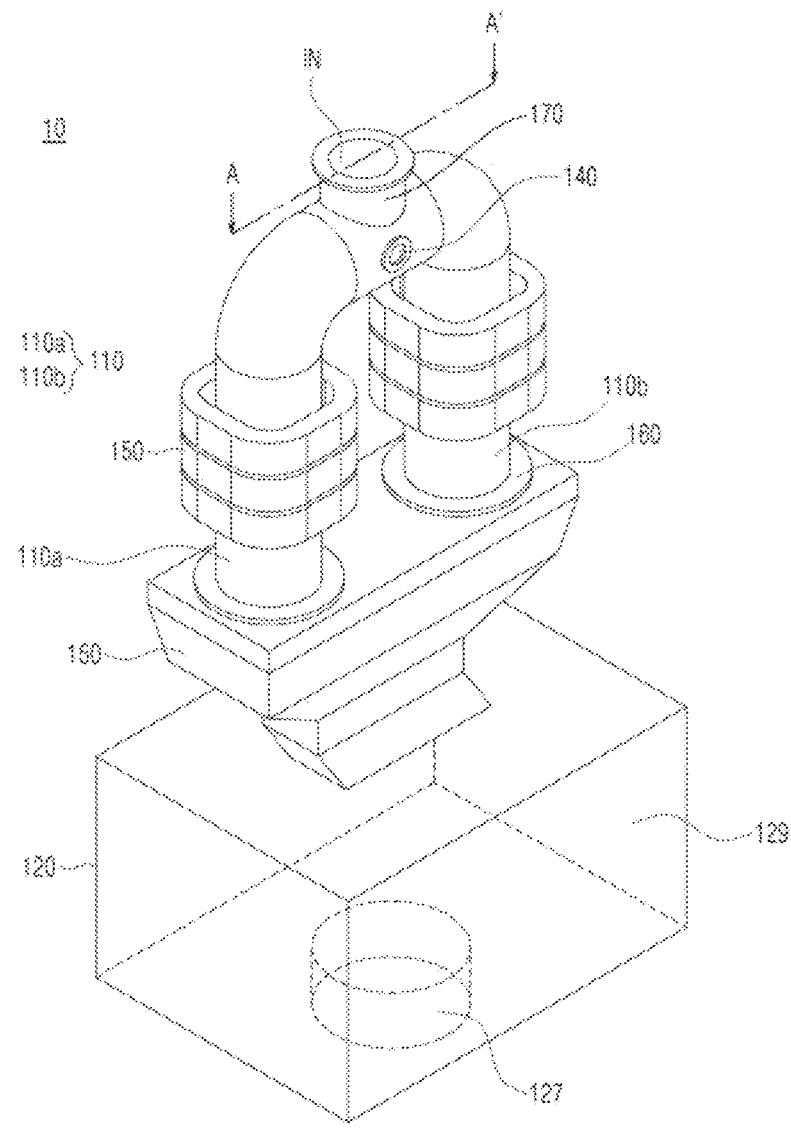
FIGS. 23A to 23D are views illustrating a plasma generating device, on which an area restricting member is mounted, according to an embodiment of the present disclosure.
Figure 23B:
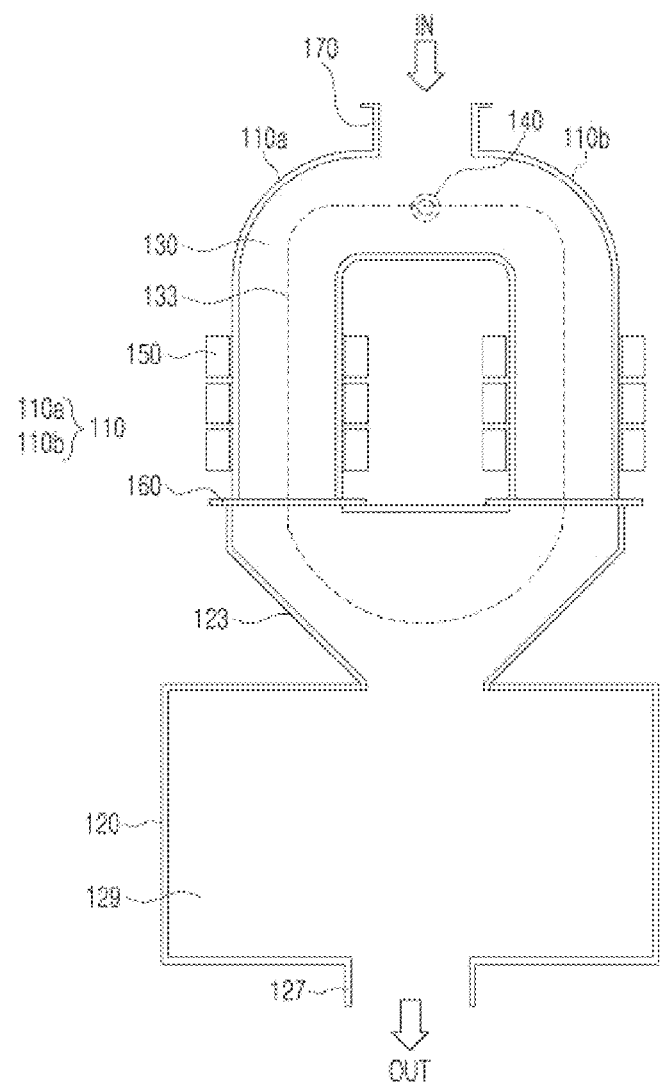
Figure 23C:
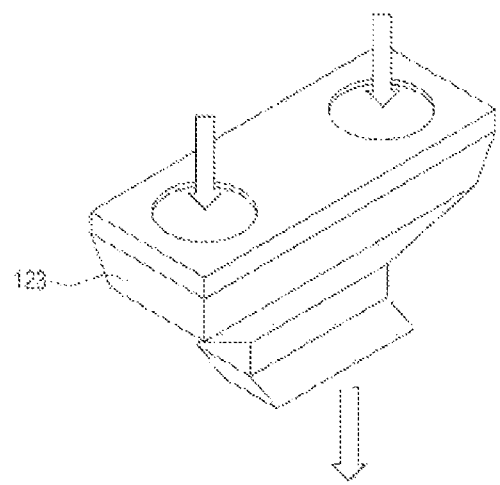
Figure 23D:
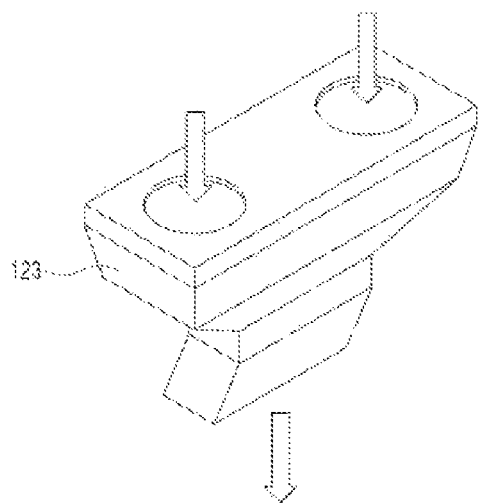

FIGS. 23A to 23D are views illustrating the plasma generating device, on which the area restricting member is mounted, according to an embodiment of the present disclosure, and FIG. 23A is a perspective view, FIG. 23B is a cross-sectional view of FIG. 23A, and FIGS. 23C and 23D are perspective views illustrating the area restricting member of FIG. 23A. Referring to FIGS. 23A to 23D, the area restricting member 123 may have a curved shape, at least a portion of which extends in a direction that is inclined with respect to the extension directions.

Furthermore, the above-described area restricting member as in FIGS. 22A to 22C and FIGS. 23A to 23C may have a form that is disposed in the collection space of the collector not to be separated, but unlike this, may be provided in a form that may be detachable from other configurations of the collector and may be advantageously maintained and repaired by separating and replacing the docking part.

The area restricting member may be coupled to the other components of the reactor body and/or the collector through the docking part. The shape or the coupling method of the docking part is not specifically limited, and for example, the reactor body and the area restricting member may be coupled to each other by using a clamp or the like. Furthermore, the area restricting member and the configurations of the lower collector may be coupled to each other in various forms, for example, in a form, in which the sealing member (for example, an O-ring) is disposed therebetween during the coupling.

Figure 24A:
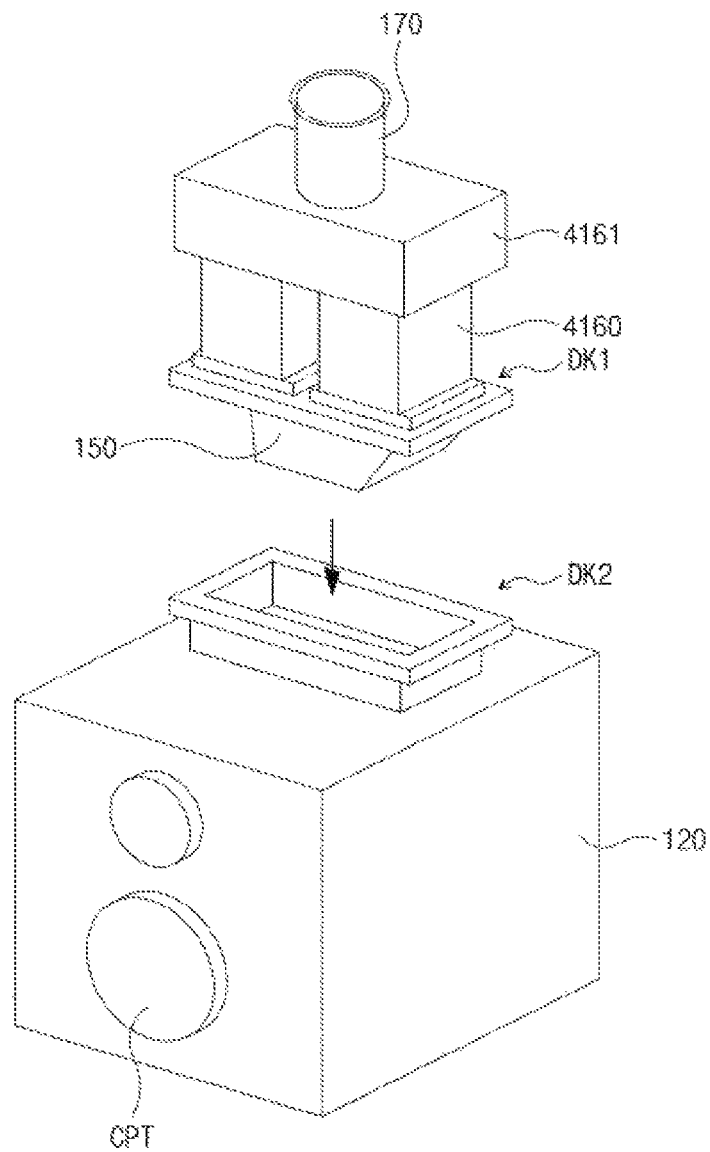
FIGS. 24A to 24C simply conceptually illustrate a plasma generating device, on which the docking part is mounted, according to an embodiment of the present disclosure.
Figure 24B:
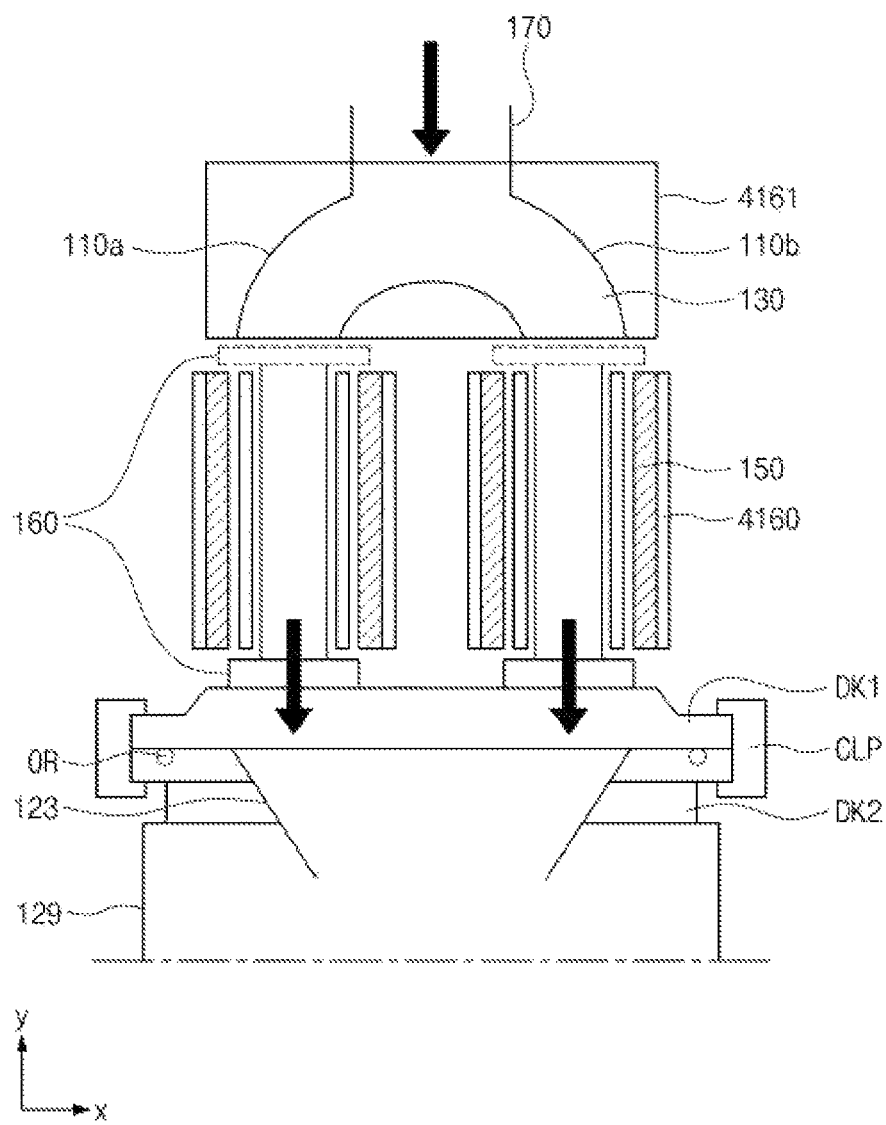
Figure 24C:
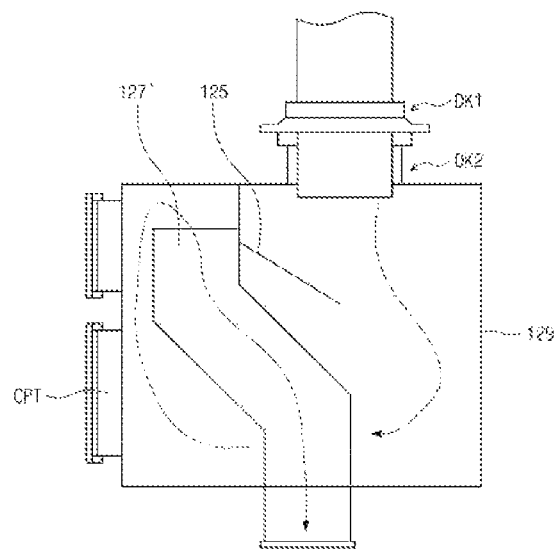

FIGS. 24A to 24C illustrate the plasma generating device, on which the docking part is mounted, according to an embodiment of the present disclosure.

FIGS. 24A to 24C illustrate the docking part of the present disclosure, and illustrate that the cooling parts 4161 and 4160 are mounted on the reactor body, as an example.

In an embodiment of the present disclosure, a reactor docking part DK1 that is connected to the branches of the reactor body to define a portion of the reaction space, a collector docking part DK2, which extends from the collector toward the reactor body and on which the reactor docking part DK1 is seated, a sealing member OR that is inserted between the reactor docking part DK1 and the collector docking part DK2, and a coupling means CLP that couples the reactor docking part DK1 and the collector docking part DK2.

The coupling means CLP is not specifically limited as long as the two docking parts DK1 and DK2 may be connected to each other, and a screw or a clamp may be used.

In an embodiment of the present disclosure, the reactor docking part DK1 may include the area restricting member 123 that is provided between the reactor body and the collector 120 to restrict at least a portion of the reaction area. The collector 120 is provided at a lower portion of the docking part. The collector 120 may be provided with a cleaning port CPT that may be opened and closed to remove the powder collected in the collection space. The interior of the collector may be easily cleaned through the cleaning port CPT.

In the present embodiment, the reference numerals that have not been described denote the same components as those denoted in FIGS. 21A to 21C, 22A to 22C, and 23A to 23D. According to an embodiment of the present disclosure, because the area restricting member is easily separated from other configurations of the collector to be replaced, the apparatus may be advantageously maintained and repaired. For example, when the area restricting member has a defect, it may be easily repaired not by replacing the entire reactor but by replacing only the area restricting member.

As described above, the area restricting member may have various forms, and the area restricting member may selectively employ any one of the embodiments according to situations, and may be variously modified within the scope of the present disclosure if necessary.

According to an embodiment of the present disclosure, because the area restricting member 123 is provided as a component of the collector 120, the reaction space 130 may be effectively controlled and the by-product after the plasma reaction may be efficiently collected in the collector 120.

The reactor system, and the plasma generating device including the same according to an embodiment may further include additional components according to a purpose thereof. For example, FIG. 25 simply conceptually illustrates the plasma generating device according to an embodiment of the present disclosure, and illustrates that a collector 30 is connected to the reactor body 110 of the plasma generating device, and an additional injection hole 171 for facilitating cleaning of the reactor body 110 is further included.

Figure 25:
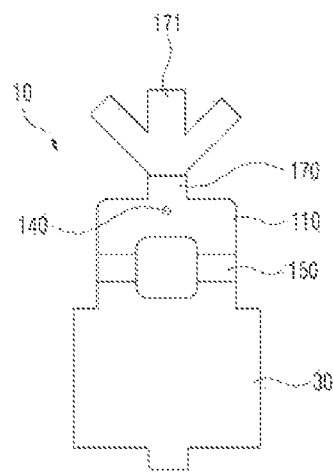
FIG. 25 simply conceptually illustrates a plasma generating device according to an embodiment of the present disclosure.

Referring to FIG. 25, the additional injection hole 171 may be integrally formed with or separately made from the reactor of the plasma generating device to be connected to the gas injection hole 170 of the plasma generating device. The additional injection hole 171 may include one opening connected to the gas injection hole 170 for injecting the process gas, and a plurality of holes for cleaning the reactor body 110 in addition. That is, at least two additional injection holes 171 may be provided, and for example, as illustrated in FIG. 9B, may have a structure having three openings. In the present embodiment, among the three openings, a middle opening is an opening for injecting the process gas, and two opening provided on opposite sides of the middle opening are openings for cleaning the reactor body 110.

In an embodiment of the present disclosure, through the plurality of openings for cleaning, which are provided on opposite sides, the interior of the reactor body 110 may be effectively cleaned on opposite sides.

In this way, the separate additional injection hole 171 is installed in addition to the gas injection hole 170 for injecting the process gas, and thus, the interior of the reactor body 110, in particular, foreign substances, such as powder, which are stacked on an upper side of the reactor body 110 may be easily cleaned in a short time. Through this, according to an embodiment of the present disclosure, a maintenance/repair time may be reduced and maintenance costs also may be reduced. In the conventional technology, although all connection structures between another configuration (for example, the process chamber 20 or the exhaust line that connects the process chamber 20 and the reactor) and the reactor have to be disassembled to clean the reactor body 110, such a disassembly process is not necessary in the present disclosure.

In an embodiment of the present disclosure, although not illustrated in the drawings, an exhaust pump for discharging the exhaust gas from the collector 30 may be further provided at a rear end of the collector 30. The plasma generating device according to an embodiment may be employed in various kinds of process executing apparatuses. For example, the plasma generating device may be used in a post-operation of the process performed in the process chamber 20 to be used for the purpose of treating the exhaust gas that exits from the process chamber. A description of the contents of the following embodiments will be omitted when the contents thereof are substantially the same as or similar to the above-described contents to avoid repetition of the description.

Figure 26:
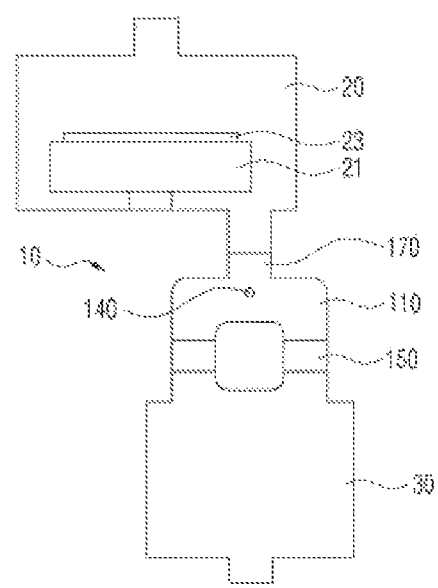
FIG. 26 is a schematic view illustrating a process executing apparatus according to an embodiment of the present disclosure.

FIG. 26 is a schematic view illustrating the process executing apparatus according to embodiments of the present disclosure, and illustrates that the plasma generating device is connected in an operation after the process in the process chamber 20 as the process executing apparatus according to an embodiment of the present disclosure.

Referring to FIG. 26, the process executing apparatus according to an embodiment of the present disclosure includes the process chamber 20, and the plasma generating device connected to the process chamber 20.

The process chamber 20 may be an ashing chamber that removes a photoresist, may be a chemical vapor deposition (CVD) chamber that is configured to deposition an insulation film, and may be an ashing chamber for forming various insulation film structures and metal wiring 181 structures. Furthermore, the process chamber may be a PVD chamber for depositing an insulation film, a metal film, or the like.

The process chamber 20 may include a susceptor 21 for supporting a to-be-treated substrate 23 in an interior thereof. The to-be-treated substrate 23, for example, may be a silicon wafer substrate for manufacturing a semiconductor device or a glass substrate for manufacturing a liquid crystal display or a plasma display, but kinds thereof are not limited thereto.

The plasma generating device is used to burn or purify harmful substances of the exhaust gas by applying plasma energy and/or purification gases to the exhaust gas of the process chamber 20. To achieve this, the gas injection hole 170 of the plasma generating device is connected to an outlet of the process chamber 20.

In an embodiment of the present disclosure, the collector 30 for collecting harmful substances of the exhaust gas may be connected to the plasma generating device, and although not illustrated, an exhaust pump for discharging the exhaust gas from the collector 30 may be further provided at a rear end of the collector 30. Furthermore, the controller that controls the process chamber 20 and/or the plasma generating device may be connected to the plasma generating device. The controller is a component for controlling overall operations of the process chamber 20 and the plasma generating device. The controller controls a power source 180 that is connected to a power supply source to supply electric power to the plasma chamber. The control may be a control of operations of the plasma chamber and the process chamber 20 by generating a control signal for controlling the plasma generating apparatus.

Although the preferred embodiment of the present disclosure has been described until now, it can be understood by an ordinary person in the art that the present disclosure may be variously corrected and changed without departing from the spirit and area of the present disclosure described in the claims.

Accordingly, the technical scope of the present disclosure is not limited to the contents descried in the detailed description, but should be determined by the claims.

The invention claimed is:

1. A plasma generating device comprising:
   a reactor body having a gas injection hole on one side thereof; and
   a collector connected to an opposite side of the reactor body and having a collection space in an interior thereof,
   wherein the reactor body and the collector respectively provide a reaction space having a plasma channel in an interior of the reactor body and the interior of the collector,
   wherein the reactor body has a shape, in which at least two branches are branched such that the at least two branches correspond to portions of a toroid connected to the collector, and further includes at least one insulator provided in the reactor body, and
   wherein the insulator is provided at at least one of between bodies constituting the reactor body, and between the reactor body and the collector.

2. The plasma generating device of claim 1, wherein the collector includes a collection container surrounding the collection space, and a portion of the reaction space and a portion of the collection space overlap each other.

3. The plasma generating device of claim 1, further comprising:
   a reactor dock connected to the at least two branches of the reactor body and configured to define a portion of the reaction space;
   a collector dock extending from the collector toward the reactor body and on which the reactor dock is seated;
   a sealer inserted between the reactor dock and the collector dock; and
   a coupler coupling the reactor dock and the collector dock.

4. The plasma generating device of claim 3, wherein the reactor dock includes:
   an area restrictor provided between the reactor body and a collection container and defining at least a portion of a reaction area.

5. The plasma generating device of claim 1, wherein the insulator includes at least two sealers configured to seal the reaction space, and wherein the at least two sealers are sequentially disposed along a first direction that faces an outside from an inside of the reactor body, or are sequentially disposed along a second direction that is perpendicular to the first direction.

6. The plasma generating device of claim 5, wherein the insulator further includes a first insulator provided between the reaction space and the at least two sealers such that the at least two sealers are not exposed to the reaction space.

7. The plasma generating device of claim 6, wherein a cross-section of the first insulator has a shape that is asymmetrical to a line that is perpendicular to a ground surface.

8. The plasma generating device of claim 1, wherein the reactor body includes first and second branch parts branched to two sides in a direction that is perpendicular to an axis with respect to the gas injection hole,
wherein the first and second branch parts includes:
first and second parallel portions extending in a direction that is parallel to the gas injection hole;
a first shoulder part connecting the gas injection hole and the first parallel portion; and
a second shoulder part connecting the gas injection hole and the second parallel portion, and
wherein in the first and second shoulder parts, a spacing distance of an inner surface that contacts a plasma forming space from the plasma channel is larger than those of the first and second parallel portions.

9. The plasma generating device of claim 1, further comprising:
a temperature sensor configured to sense a temperature of the reactor body;
at least one cooler provided in the reactor body; and
a controller configured to control an on/off state of at least one of the reactor body and the at least one cooler based on the temperature sensed by the temperature sensor.

10. The plasma generating device of claim 9, wherein the at least one cooler is spaced apart from the reactor body, and
wherein the plasma generating device further comprises an absorber provided between the reactor body and the at least one cooler as a conductor, and configured to absorb heat transfer between the reactor body and the at least one cooler.

11. The plasma generating device of claim 10, further comprising:
a heating part provided between the reactor body and the cooler and configured to provide heat for raising a temperature of the reactor body.

12. The plasma generating device of claim 1, further comprising:
an igniter mounted on the reactor body and configured to initiate plasma discharge in the reaction space,
wherein the igniter includes:
an ignition port extending from the reactor body;
an ignition electrode, at least a portion of which is provided in the ignition port; and
sealers provided between the ignition port and the ignition electrode, and spaced apart from the ignition electrode.

13. The plasma generating device of claim 12, wherein the ignition port is integrally formed with the reactor body so as not to be separated therefrom, and wherein the ignition port includes:
an extension part protruding and extending from the reactor body; and
a flange provided at an end of the extension part, which is opposite to the reactor body.

14. The plasma generating device of claim 13, wherein the ignition electrode includes:
an electrode body, one end of which faces the reactor body; and
a head part connected to the electrode body and having a diameter that is larger than that of the electrode body.

15. The plasma generating device of claim 1, wherein the collector includes:
a housing disposed on a passage of an exhaust gas and configured to provide a collection space for collecting powder; and
a passage guide provided in the collection space and configured to change a direction of the passage of the exhaust gas.

16. The plasma generating device of claim 15, wherein the passage guide includes:
a partition part dividing the collection space into two or more spaces,
wherein the partition part includes:
a plate-shaped portion disposed in the collector to be adjacent to the first exhaustion part connected to the reactor body and configured to guide the passage of the exhaust gas; and
a communication portion disposed to be spaced apart from the first exhaustion part while the plate-shaped portion being interposed therebetween, and
wherein an upper end of the communication portion is opened and a lower end thereof is connected to a second exhaustion part disposed to be spaced apart from the first exhaustion part and from which the exhaust gas is discharged.

17. The plasma generating device of claim 15, wherein the housing is provided with a cleaning port that is opened and closed to remove the powder collected in the collection space.

18. The plasma generating device of claim 1, further comprising:
a connector, one end of which is provided in the gas injection hole and which has two or more openings communicated with an interior of the reactor body at an opposite end thereof,
wherein the connector includes:
a main body; and
a main injector hole connected to the main body and into which process by-product are injected as one of the openings; and
an auxiliary injection hole connected to the main body and into which an additional gas is injected as another one of the openings.

19. The plasma generating device of claim 1, wherein a process chamber configured to treat a substrate is connected to a front end of the reactor body, and
wherein an exhaustion pump is connected to a rear end of the collector.

* * * * *